US007112904B2

(12) United States Patent  (10) Patent No.: US 7,112,904 B2
Akiyama  (45) Date of Patent: Sep. 26, 2006

(54) MAGNETIC ROTATION TRANSMITTING DEVICE, HERMETIC STIRRING UNIT, AND ELECTRIC FURNACE

(75) Inventor: Shinichi Akiyama, Saitama (JP)

(73) Assignee: Maguneo Co., Ltd., Saitama (JP)

( * ) Notice: Subject to any disclaimer, the term of this patent is extended or adjusted under 35 U.S.C. 154(b) by 61 days.

(21) Appl. No.: 11/076,659

(22) Filed: Mar. 10, 2005

(65) Prior Publication Data

US 2005/0206260 A1  Sep. 22, 2005

(30) Foreign Application Priority Data

Mar. 16, 2004  (JP) ............................. 2004-074978

(51) Int. Cl.
 *H02K 49/06* (2006.01)
 *H02K 5/10* (2006.01)
 *H05B 6/24* (2006.01)
 *H05B 3/62* (2006.01)
 *B01F 3/06* (2006.01)

(52) U.S. Cl. .................... 310/103; 310/75 R; 310/114; 369/266; 366/247; 366/605; 373/77; 373/118; 373/140

(58) Field of Classification Search .............. 310/75 R, 310/103, 105, 112, 114, 115, 126; 369/266; 366/605, 247; 373/118, 125, 140
See application file for complete search history.

(56) References Cited

U.S. PATENT DOCUMENTS 1,418,030 A * 5/1922 Speirs ......................... 373/118

(Continued)

FOREIGN PATENT DOCUMENTS

EP  000039777 A2 * 11/1981 .................. 310/103

JP  362031364 A * 2/1987 .................. 310/103

(Continued)

*Primary Examiner*—Tran Nguyen
(74) *Attorney, Agent, or Firm*—Notaro & Michalos PC

(57) ABSTRACT

In order to provide a magnetic rotation transmitting device capable of obtaining a large transmitting torque without using a large-sized permanent magnet, in an axial-type magnetic rotation transmitting device, which includes a driving rotation body having one or plural magnetic line(s) in which plural first magnets (10A) are disposed in a circumferential direction on a first disk (11A) at almost equal intervals, a drive source rotationally driving a drive shaft of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap and, which utilizes a magnetic operation and which allows the driven rotation body to rotate by rotationally driving the drive shaft by means of the drive source, the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10A) adjacent to each other on the first disk (11A) are disposed so that magnetic pole faces having the same polarity make pairs, and adjacent and facing surfaces of the second magnets (20A) adjacent to each other on the second disk (21A) are disposed so that the magnetic pole faces having the same polarity make pairs.

8 Claims, 10 Drawing Sheets

U.S. PATENT DOCUMENTS

| | | | |
|---|---|---|---|
| 2,579,874 A * | 12/1951 | Shaw | 366/247 |
| 2,702,693 A * | 2/1955 | Kay | 366/243 |
| 2,790,095 A * | 4/1957 | Peek et al. | 310/103 |
| 3,895,245 A * | 7/1975 | Bode | 310/46 |
| 4,163,164 A * | 7/1979 | Pieters | 310/103 |
| 2002/0186647 A1 * | 12/2002 | Her et al. | 369/266 |
| 2004/0066107 A1 * | 4/2004 | Gery | 310/103 |

FOREIGN PATENT DOCUMENTS

| | | | |
|---|---|---|---|
| JP | 402294261 A * | 12/1990 | 310/103 |
| JP | 2678569 | 8/1997 | |

* cited by examiner (A)

(B)

(A)

(B)

(C)

(A)

(B)

MAGNETIC ROTATION TRANSMITTING DEVICE, HERMETIC STIRRING UNIT, AND ELECTRIC FURNACE

BACKGROUND OF THE INVENTION

1. Field of the Invention

The present invention relates to a magnetic rotation transmitting device transmitting the rotation by an electric coupling, a hermetic stirring unit driving a stirring blade inside a hermetic container by the magnetic rotation transmitting device, and an electric furnace driving a pulling shaft of a single crystal or a crucible rotating shaft by using the magnetic rotation transmitting device.

2. Description of the Related Art

As a conventional magnetic rotation transmitting device transmitting a rotational motion from a drive side to a driven side by magnetically coupling permanent magnets in the drive side with permanent magnets in the side to be driven (driven side), the inventor has developed and proposed the one having a structure such that a right-and-left double pole magnet is used to one of the drive side and the driven side, and a both-surfaces double pole magnet is used to the other side (refer to Japanese Patent Application Laid-open No. 2678569).

Recently, a magnetic rotation transmitting device transmitting a large torque (the moment of power around a rotating shaft. A product obtained by multiplying a distance from the rotating shaft to a point of action of the force by a value of the force.) is required. In order to increase the transmitting torque in the conventional-type magnet rotation transmitting device described above, the size of respective magnets in the drive side and the driven side is required to be large, however, it is difficult to manufacture a large-sized permanent magnet having an uniform magnetic performance, and there exists a limit to allow the magnet to be large.

SUMMARY OF THE INVENTION

The present invention is made to solve the aforementioned problems, and an object of the present invention is to provide a magnet rotation transmitting device capable of obtaining large transmitting torque without using large-sized permanent magnets.

In order to solve the aforementioned problems, a magnetic rotation transmitting device relating to claim 1 of the present invention is an axial-type magnetic rotation transmitting device, which includes a driving rotation body having one or plural magnetic line(s) in which plural first magnets (10A) are disposed in a circumferential direction on a first disk (11A) at almost equal intervals, a drive source rotationally driving a drive shaft of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap and, which utilizes a magnetic operation and which allows the driven rotation body to rotate by rotationally driving the drive shaft by means of the drive source, characterized in that the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10A) adjacent to each other on the first disk (11A) are disposed so that magnetic pole faces having the same polarity make pairs, and adjacent and facing surfaces of the second magnets (20A) adjacent to each other on the second disk (21A) are disposed so that the magnetic pole faces having the same polarity make pairs.

A magnetic rotation transmitting device relating to claim 2 is a radial-type magnetic rotation transmitting device, which includes a driving rotation body having one or plural magnetic line(s) in which plural first magnets (10B) are disposed in a circumferential direction on an inner wall of a cylinder (11B) at almost equal intervals, a drive source rotationally driving a drive shaft of the driving rotation body, and a driven rotation body having one or plural magnet line(s) in which second magnets (20B) of the same number as the first magnets (10B) are disposed in the circumferential direction on an outer wall of a column (21B) housed in the cylinder (11B) at almost equal intervals, symmetrically disposed to, and magnetically coupled with the driving rotation body with a magnetic coupling gap, which utilizes a magnetic operation and which allows the driven rotation body to rotate by rotationally driving the drive shaft by means of the drive source, characterized in that the first magnet (10B) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20B) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10B) adjacent to each other on the cylinder (11B) are disposed so that magnetic pole faces having the same polarity make pairs, and adjacent and facing surfaces of the second magnets (20B) adjacent to each other on the column (21B) are disposed so that the magnetic pole faces having the same polarity make pairs.

A hermetic stirring unit relating to claim 3 of the present invention is a hermetic stirring unit including a hermetic container (31A), a stirring blade (32A), a driven shaft (52A) and a magnetic rotation transmitting device, in which the magnetic rotation transmitting device is an axial-type magnetic rotation transmitting device which includes a driving rotation body having one or plural magnetic line(s) in which plural first magnets (10A) are disposed in a circumferential direction on a first disk (11A) at almost equal intervals, a drive source (41A) rotationally driving a drive shaft (42A) of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap, which utilizes a magnetic operation and which allows the driven shaft (52A) to rotate by rotationally driving the drive shaft (42A) by means of the drive source (41A), characterized in that the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10A) adjacent to each other on the first disk (11A) are disposed so that magnetic pole faces having the same polarity make pairs, adjacent and facing surfaces of the second magnets (20A) adjacent to each other on the second disk (21A) are disposed so that the magnetic pole faces having the same polarity make pairs, and the stirring blade (32A) is rotatably attached to the driven shaft (52A) installed to the driven rotation body so that the driven center line is allowed to be the rotation center line.

A hermetic stirring unit relating to claim 4 of the present invention is a hermetic stirring unit including a hermetic container (31B), a stirring blade (32B), a driven shaft (52B) and a magnetic rotation transmitting device, in which the magnetic rotation transmitting device is a radial-type magnetic rotation transmitting device which includes a driving rotation body having one or plural magnetic line(s) in which plural first magnets (10B) are disposed in a circumferential direction on an inner wall of a cylinder (11B) at almost equal intervals, a drive source (41B) rotationally driving a drive shaft (42B) of the driving rotation body, and a driven rotation body having one or plural magnet line(s) in which second magnets (20B) of the same number as the first magnets (10B) are disposed in the circumferential direction on an outer wall of a column (21B) housed in a cylinder (11B) at almost equal intervals, symmetrically disposed to, and magnetically coupled with the driving rotation body with a magnetic coupling gap, which utilizes a magnetic operation and which allows the driven shaft (52B) to rotate by rotationally driving the drive shaft (42B) by means of the drive source (41B), characterized in that the first magnet (10B) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20B) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10B) adjacent to each other on the cylinder (11B) are disposed so that magnetic pole faces having the same polarity make pairs, adjacent and facing surfaces of the second magnets (20B) adjacent to each other on the column (21B) are disposed so that the magnetic pole faces having the same polarity make pairs, and the stirring blade (32B) is rotatably attached to the driven shaft (52B) installed to the driven rotation body so that the driven center line is allowed to be the rotation center line.

A hermetic stirring unit relating to claim 5 of the present invention is a hermetic stirring unit including a hermetic container (31C) having a fixing shaft (33A) thereinside, a stirring blade and a magnetic rotation transmitting device, in which the magnetic rotation transmitting device is an axial-type magnetic rotation transmitting device which includes a driving rotation body having one or plural magnetic line(s) in which plural first magnets (10A) are disposed in a circumferential direction on a first disk (11A) at almost equal intervals, a drive source (41C) rotationally driving a drive shaft (42C) of the driving rotation body, and a driven rotation body having one or plural magnet line(s) in which second magnets (20C) of the same number as the first magnets (10A) are disposed in the circumferential direction on a second disk (21C) at almost equal intervals, symmetrically disposed to, and magnetically coupled with the driving rotation body with a magnetic coupling gap, which utilizes a magnetic operation and which allows the driven rotation body to rotate by rotationally driving the drive shaft (42C) by means of the drive source (41C), characterized in that the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20C) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10A) adjacent to each other on the first disk (11A) are disposed so that magnetic pole faces having the same polarity make pairs, adjacent and facing surfaces of the second magnets (20C) adjacent to each other on the second disk (21C) are disposed so that the magnetic pole faces having the same polarity make pairs, and the fixing shaft (33A) is inserted into a driven-shaft through hole as a through hole of a circular section formed so as to include the driven center line of the driven rotation body, the driven rotation body is rotatably attached through bearing members (34A) and the stirring blade is attached to the driven rotation body.

A hermetic stirring unit relating to claim 6 of the present invention is a hermetic stirring unit including a hermetic container (31D) having a fixing shaft (33B) thereinside, a stirring blade, and a magnetic rotation transmitting device, in which the magnetic rotation transmitting device is a radial-type magnetic rotation transmitting device which includes a driving rotation body having one or plural magnetic line(s) in which plural first magnets (10C) are disposed in a circumferential direction on an outer wall of a column (11C) at almost equal intervals, a drive source (41D) rotationally driving a drive shaft (42D) of the driving rotation body, and a driven rotation body having one or plural magnet line(s) in which second magnets (20D) of the same number as the first magnets (10C) are disposed in the circumferential direction on an inner wall of a cylinder (21D) housing the column at almost equal intervals, symmetrically disposed to, and magnetically coupled with the driving rotation body with a magnetic coupling gap, which utilizes a magnetic operation and which allows the driven rotation body to rotate by rotationally driving the drive shaft (42D) by means of the drive source (41D), characterized in that the first magnet (10C) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20D) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10C) adjacent to each other on the column (11C) are disposed so that magnetic pole faces having the same polarity make pairs, adjacent and facing surfaces of the second magnets (20D) adjacent to each other on the cylinder (21D) are disposed so that the magnetic pole faces having the same polarity make pairs, and the fixing shaft (33B) is inserted into a driven-shaft through hole as a through hole of a circular section formed so as to include the driven center line of the driven rotation body, the driven rotation body is rotatably attached through bearing members (34B) and the stirring blade is attached to the driven rotation body.

An electric furnace relating to claim 7 is an electric furnace including a pressure resistant vessel, a crucible provided in the pressure-resistant vessel, a crucible supporting shaft supporting the crucible, a heating means heating materials in the crucible, a pulling shaft of a single crystal for pulling up a crystal from the crucible, and a radial-type magnetic rotation transmitting device rotating the pulling shaft and/or the crucible supporting shaft, in which the radial-type magnetic rotation transmitting device includes a drive rotation body having one or plural magnet line(s) in which plural first magnets (10B), (10B) are disposed on an outer periphery to a lower hermetic barrel unit (67) and an upper hermetic barrel unit (68) at almost equal intervals, and a driven rotation body having one or plural magnet line(s) in which second magnets (20B), (20B) of the same number as the respective first magnets (10B), (10B) are disposed in a circumferential direction on outer walls of second rotating columns (21B), (21B) housed in the lower hermetic barrel unit (67) and the upper hermetic barrel unit (68) at almost equal intervals, symmetrically disposed to, and magnetically coupled with the driving rotation body with a magnetic coupling gap, which utilizes a magnetic operation and which allows the second magnets (20B), (20B) to rotate and/or to slide in upper and lower directions by rotationally driving the first magnets (10B), (10B), characterized in that the first magnets (10B), (10B) respectively have N-magnetic pole portions and a S-magnetic pole portions, and an extended surface of a boundary surface between the N-magnetic pole portion and the S-magnetic pole portion approximately overlaps with a driving center line as being a rotation center line of the driving rotation body, the second magnets (20B), (20B) respectively have the N-magnetic pole portions and the S-magnetic pole portions, and the extended surface of the boundary surface between the N-magnetic pole portion and the S-magnetic pole portion approximately overlaps with a driven center line as being the rotation center line of the driven rotation body, adjacent and facing surfaces of the first magnets (10B), (10B) are disposed so that magnetic pole faces having the same polarity make pairs, adjacent and facing surfaces of the second magnets (20B), (20B) adjacent to each other on the second rotating columns (21B), (21B) are disposed so that the magnetic pole faces having the same polarity make pairs, and the crucible and a seed crystal are rotatably attached to the crucible supporting shaft and the pulling shaft installed to the driven rotation body so that the driven center line is allowed to be the rotation center line.

An electric furnace relating to claim 8 is an electric furnace including a pressure resistant vessel, a crucible provided in the pressure-resistant vessel, a crucible supporting shaft supporting the crucible, a heating means heating materials in the crucible, and an axial-type magnetic rotation transmitting device rotating the crucible, in which the axial-type magnetic rotation transmitting device includes a driving rotation body having one or plural magnet line(s) in which plural first magnets (10A) are disposed in a circumferential direction on a first disk (11A) at almost equal intervals, a drive source (41A) rotationally driving a drive shaft (42A) of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap, which utilizes a magnetic operation and which allows the crucible supporting shaft to rotate by rotationally driving the drive shaft (42A) by the drive source (41A), characterized in that the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, adjacent and facing surfaces of the first magnets (10A) adjacent to each other on the first disk (11A) are disposed so that magnetic pole faces having the same polarity make pairs, adjacent and facing surfaces of the second magnets (20A) adjacent to each other on the second disk (21A) are disposed so that the magnetic pole faces having the same polarity make pairs, and the crucible is rotatably attached to the crucible supporting shaft installed to the driven rotation body so that the driven center line is allowed to be the rotation center line.

According to the magnetic rotation transmitting device, the hermetic stirring unit and the electric furnace relating to the present invention, they are constituted so that the plural first magnets are disposed in the circumferential direction on the disk, the cylinder, or the column in the drive side driven by the drive source at almost equal intervals, that the second magnets of the same number as the first magnets are disposed in the circumference direction on the disk, the column, or the cylinder installed facing the disk and the like in the drive side at almost equal intervals, that the magnetic coupling gap is provided between the first magnets and the second magnets, that adjacent and facing surfaces of the first magnets adjacent to each other on the disk and the like in the drive side are disposed so that the magnetic pole faces having the same polarity make pairs, and that adjacent and facing surfaces of the second magnets adjacent to each other on the disk and the like in the driven side are disposed so that the magnetic pole faces having the same polarity make pairs, as a result, the magnetic force in the space where the same magnetic pole faces of the first magnets in the drive side make pairs (same-polarity magnetic field space) becomes stronger than the magnetic force of the normal magnetic pole, and the magnetic force in the space where the same magnetic pole faces of the second magnets in the driven side make pairs (same-polarity magnetic field space) also becomes stronger than the magnetic force of the normal magnetic pole. In addition, the first magnets and the second magnet are plural and same in number. Therefore, even if the magnetic force of one first magnet or one second magnet is same as the normal magnetic force, the magnetic force reinforcing effect obtained by allowing the same magnetic pole faces to be pairs as described above is added to the magnetic force of the product obtained by multiplying the magnetic force of one first magnet by the number of the first magnets in the whole first magnets in the drive side, and the magnetic force reinforcing effect by allowing the same magnetic pole faces to be pairs as described above is added to the magnetic force of the product obtained by multiplying the magnetic force of one second magnet by the number of the second magnets in the whole second magnets in the driven side, resultingly, the torque to be transmitted to the driven side can be increased as the whole magnetic rotation transmitting device and as the whole hermetic stirring unit.

DETAILED DESCRIPTION OF THE PREFERRED EMBODIMENTS

Embodiments which will be described hereinafter have structure in which plural first magnets as being permanent magnets are disposed in a circumference direction at almost equal intervals on a disk, a cylinder or a column in a drive side driven by a drive source, in which second magnets as being permanent magnets of the same number as the first magnets in the circumference direction at almost equal intervals on the disk, the column or the cylinder in a driven side disposed facing to the disk and so on in the drive side, in which a magnetic coupling gap is arranged between the first magnets and the second magnets, in which adjacent and facing surfaces of the first magnets adjacent to each other on the disk and so on in the drive side are disposed so that magnetic pole faces having same polarity make pairs, and in which adjacent and facing surfaces of the second magnets adjacent to each other in the disk and so on in the driven side are disposed so that the magnetic pole faces having same polarity make pairs. This is the optimal mode as the structure for realizing the present invention, in which a magnetic force reinforcing effect in a space where the same magnetic poles make pairs (same-polarity magnetic field space) as described above is added to the magnetic force of a product obtained by multiplying the magnetic force of one first magnet by the number of the first magnet in the whole first magnets of the drive side, even if the magnet force of an individual permanent magnet is similar to the normal one, and in which the magnetic force reinforcing effect in the space where the same magnetic poles make pairs (same-polarity magnetic field space) as described above is added to the magnetic force of a product obtained by multiplying the magnetic force of one second magnet by the number of the second magnet in the whole second magnets of the driven side, accordingly as the whole magnetic rotation transmitting device or the whole hermetic stirring unit, a transmitting torque to the driven side can be increased.

First Embodiment

Figure 1:
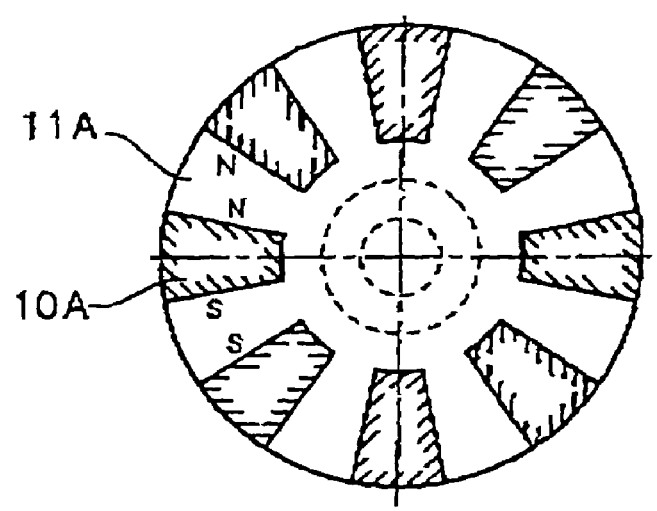
FIG. 1A and FIG. 1B are views showing a structure of a magnetic rotation transmitting device as a first embodiment of the present invention.
Figure 1:
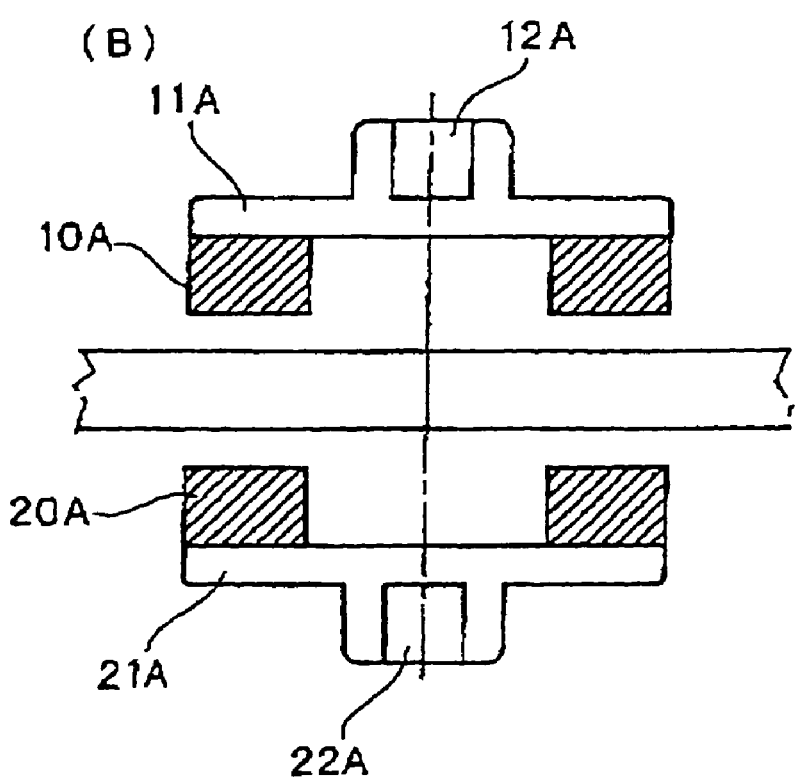

Hereinafter, a first embodiment of the present invention will be explained with reference to the drawings. FIG. 1A and FIG. 1B are views showing a structure of a magnetic rotation transmitting device as being the first embodiment of the present invention. In FIG. 1, FIG. 1B is a sectional view seen from a side surface of the magnetic rotation transmitting device of the first embodiment of the present invention. FIG. 1A is a bottom view of a first disk 11A (later described) looked up from below in FIG. 1B.

As shown in FIG. 1A and FIG. 1B, the magnetic rotation transmitting device of the first embodiment of the present invention is constituted by including driving rotation body having a first disk 11A and a first magnet 10A, and a driven rotation body having a second disk 21A and a second magnet 20A.

The first disk 11A is a member made of materials which are not magnetized or which do not tend to be magnetized (nonmagnetic materials), for example, nonmagnetic metal materials (such as an austenitic stainless steel, an aluminum alloy and the like), or an FRP (fiber reinforced plastic) and the like, and formed to be a disk shape or a circular-plate shape.

The first magnet 10A is a permanent magnet, which is formed to be a columnar solid shape having a sector cross-sectional shape. As the permanent magnet, an alnico magnet, a ferrite magnet, rare-earth magnets and a bond magnet can be used. As the rare-earth magnets, a samarium-cobalt magnet, a neodymium-iron-boron magnet, a samarium-iron-nitrogen magnet, a platinum-iron magnet, a platinum-cobalt magnet, a manganese-aluminum magnet, an iron-chromium-cobalt magnet and the like can be used.

In an example of FIG. 1A, the eight first magnets 10A are disposed on the first disk 11A in a circumferential direction at almost equal intervals. The eight first magnets 10A disposed side-by-side circumferentially correspond to one magnet line in claims. A planar shape of an individual first magnet 10A is approximately sectorial, and a center line of the sector practically overlaps with a nearly radial straight line running through the center of a circle of the first disk 11A.

The aforementioned first magnet 10A has a N-magnetic pole portion denoted as a symbol 'N' in FIG. 1A and a S-magnetic pole portion denoted as a symbol 'S' in FIG. 1A. A boundary surface between the N-magnetic pole portion and the S-magnetic pole portion is allowed to approximately correspond to the center line of the sector formed by the first magnet 10A, and an extended surface of the boundary surface between the N-magnetic pole portion and the S-magnetic pole portion is disposed so as to practically overlap with, or practically contact a rotation center line of a driving rotation body (hereinafter, referred to as a driving center line).

Adjacent and facing surfaces (side surfaces) of the two first magnets 10A, 10A adjacent to each other on the first disk 11A are disposed so that magnetic pole faces having same polarity make a pair (one set). For example, the adjacent and facing surfaces of the two first magnets 10A, 10A adjacent to each other on the first disk 11A are disposed so that a N-pole faces a N-pole, and a S pole faces a S-pole. Hereinafter, the pair of the N-pole and the N-pole is denoted as (N, N) and the pair of the S-pole and the S-pole is denoted as (S, S).

At the center of the side opposite to the side where the first magnets 10A are disposed in the first disk 11A, a mortise for a drive shaft 12A is provided (refer to FIG. 1B). A straight line connecting the center of the first disk 11A to the center of the mortise for the drive shaft 12A approximately corresponds to the driving center line of the driving rotation body.

A drive shaft (not shown) of a drive source such as an electric motor (not shown) can be fitted to the mortise for the drive shaft 12A, and the driving rotation body is allowed to be rotationally driven by the drive source. In this case, the rotation center line of the drive shaft approximately corresponds to the driving center line.

The second disk 21A is a member made of the materials which are not magnetized or which do not tend to be magnetized (nonmagnetic materials), for example, the nonmagnetic metal materials (such as the austenitic stainless steel, the aluminum alloy), or the FRP (fiber reinforced plastic) and the like, and formed to be the disk shape or the circular-plate shape.

The second magnet 20A is a permanent magnet, which is formed to be a columnar solid shape having a sector cross-sectional shape. As the permanent magnet, the alnico magnet, the ferrite magnet, the rare-earth magnets and the bond magnet can be used. As the rare-earth magnets, the samarium-cobalt magnet, the neodymium-iron-boron magnet, the samarium-iron-nitrogen magnet, the platinum-iron magnet, the platinum-cobalt magnet, the manganese-aluminum magnet, the iron-chromium-cobalt magnet and the like can be used.

In the example of the FIG. 1, the eight second magnets 20A of the same number as the eight first magnets 10A are disposed on the second disk 21A in a circumferential direction at almost equal intervals. The eight second magnets 20A disposed side-by-side circumferentially correspond to one magnet line in claims. The planar shape of an individual second magnet 20A is approximately sectorial, and the center line of the sector practically overlaps with the nearly radial straight line running through the center of a circle of the second disk 21A.

An disposition state of the second magnets 20A (intervals between adjacent second magnets, differences of the central angle between adjacent second magnets or the like) is set to be similar to the disposition state of the first magnets 10A (intervals between adjacent first magnets, differences of the central angle between adjacent first magnets or the like).

Therefore, the second magnet 20A, though a planar disposition state thereof is not shown, has the N-magnetic pole portion and the S-magnetic pole portion in the same way as the case of the first magnet 10A, disposed such that the boundary surface between the N-magnetic pole portion and the S-magnetic pole portion is allowed to approximately correspond to the center line of the sector formed by the second magnet 20A, and that an extended surface of the boundary surface between the N-magnetic pole portion and the S-magnetic pole portion practically overlaps with, or practically contacts the rotation center line of a driven rotation body (hereinafter, referred to as a driven center line).

In the same way as the case of the first magnet 10A, though not shown, adjacent and facing surfaces (side surfaces) of the two second magnets 20A, 20A adjacent to each other on the second disk 21A are disposed so that magnetic pole faces having the same polarity make a pair (one set). For example, the adjacent and facing surfaces of the two second magnets 20A, 20A adjacent to each other on the second disk 21A are disposed so that a N-pole faces a N-pole, and a S-pole faces a S-pole, namely, such as (N, N) and (S, S).

At the center of the side opposite to the side where the second magnets 20A are disposed in the second disk 21A, a mortise for a drive shaft 22A is provided (refer to FIG. 1B). A straight line connecting the center of the second disk 21A to the center of the mortise for the drive shaft 22A approximately corresponds to the driven center line of the driven rotation body.

As shown in FIG. 1B, a predetermined gap (hereinafter referred to as "magnetic coupling gap") is set between a lower surface of the first magnet 10A and an upper surface of the second magnet 20A. In order to secure the magnetic coupling gap, a plate-shaped partition (partition plate) made of the nonmagnetic materials and the like is disposed between the lower surface of the first magnet 10A and the upper surface of the second magnet 20A as shown in FIG. 1B. It is also preferable that a locking member (not shown) which does not move in an axial direction (a direction coming close to the driven rotation body, or a direction getting away from the driven rotation body) is attached to a bearing member of the drive shaft (not shown) installed to the driving rotation body, and the locking member (not shown) which does not move in the axial direction (the direction coming close to the driving rotation body, or the direction getting away from the driving rotation body) is attached to the bearing member of the driven shaft (not shown) installed to the driven rotation body.

Figure 2:
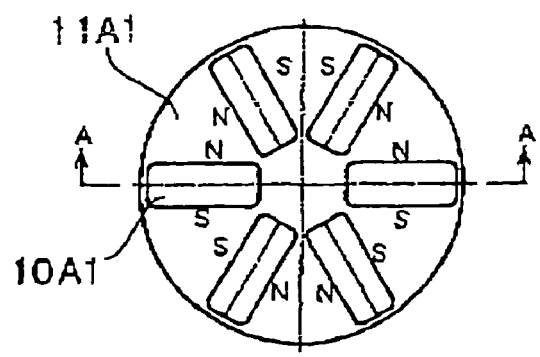
FIG. 2A to FIG. 2C are views explaining the operation and principle of the magnetic rotation transmitting device as the first embodiment of the present invention.
Figure 2:
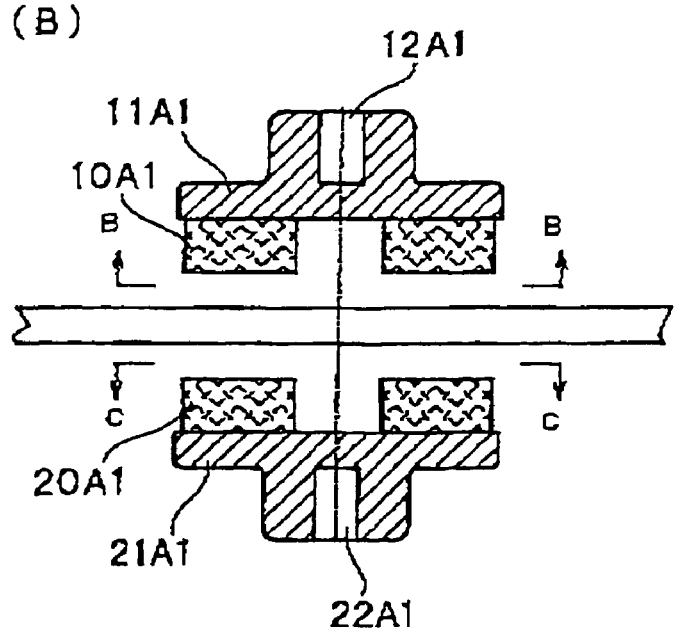
Figure 2:
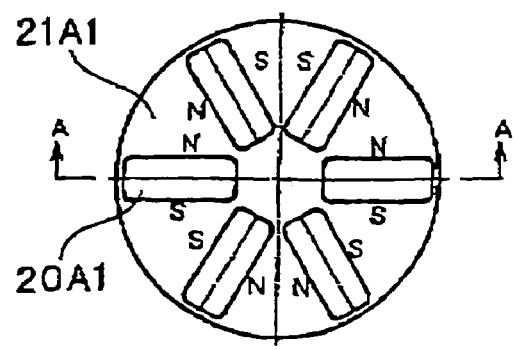
Figure 3:
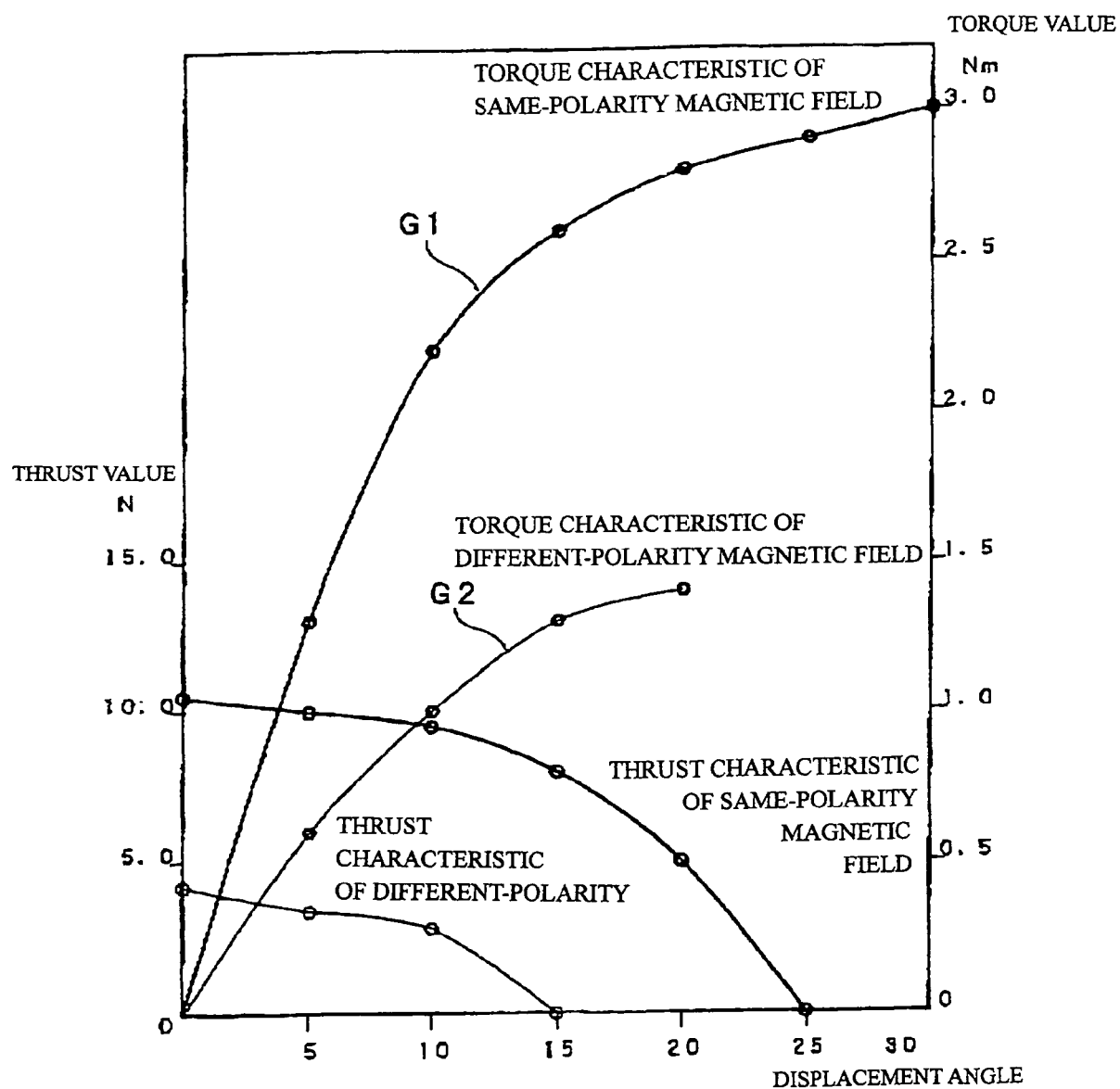
FIG. 3 is a graph explaining characteristics of the magnetic rotation transmitting device as the first embodiment of the present invention.

The operation of the magnetic rotation transmitting device of the first embodiment of the present invention constituted as described above will be explained with reference to FIG. 1 and FIG. 2. FIG. 2A to FIG. 2C are views of explaining the operation and principle of the magnetic rotation transmitting device as the first embodiment of the present invention. FIG. 2B shows a sectional view (the sectional view seen along A—A direction in FIG. 2A and FIG. 2C) seen from a side surface of the magnetic rotation transmitting device as one modification example of the first embodiment of the present invention, FIG. 2A shows a bottom view looked up along the B—B direction in FIG. 2B, and FIG. 2C shows a top view looked down along the C—C direction in FIG. 2B, respectively. And FIG. 3 is a graph explaining a characteristic of the magnetic rotation transmitting device as a first embodiment of the present invention.

The magnetic rotation transmitting device as one modification example of the first embodiment of the present invention shown in FIG. 2A to FIG. 2C has the similar structure as the magnetic rotation transmitting device of the first embodiment shown in FIG. 1A and FIG. 1B, except that a first magnet 10A1 and a second magnet 20A1 have a nearly rectangular parallelepiped shape and that the first magnets 10A1 and the second magnets 20A1 are respectively six in number.

In the magnetic rotation transmitting device as one modification example of the first embodiment of the present invention shown in FIG. 2A to FIG. 2C, a drive shaft (not shown) of a drive source such as an electric motor (not shown) can be fitted to a mortise for the drive shaft 12A1. By using this, the drive shaft (not shown) of the drive source such as the electric motor (not shown) is allowed to be fitted to the mortise for the drive shaft 12A1. Under this state, the drive source such as the electric motor (not shown) is allowed to be actuated to rotationally drive a driving rotation body. In this case, a N-magnetic pole of a first magnet and a S-magnetic pole of a certain second magnet 20A1 are attracted to each other and a S-magnetic pole of the first magnet 10A1 and a N-magnetic pole of the second magnet 20A1 are attracted to each other. Such relation is called as a "magnetic coupling" and an attracting operation by the magnetic force is called as a "magnetic operation". In the same way as the above, all the N-magnetic poles or the S-magnetic poles of the first magnets 10A1 can make the magnetic coupling relation attracted to each other between the N-magnetic poles or the S-magnetic poles of the second magnets 20A1. According to a rotational motion of the first magnets 10A1, which is accompanied with the rotation of the driving rotation body, the second magnets 20A1 are attracted, then, the driven rotation body starts rotating, and finally, a rotational speed of the driven rotation body becomes equal to a rotational speed of the driving rotation body.

In this case, as shown in the drawings, the number of the first magnets 10A1 (six) is same as the number of the second magnets 20A1 (six). Thus, even if the magnetic force of one first magnet 10A1 or one second magnet 20A1 has approximately the same value as the ordinary magnetic force, the magnetic force of the whole first magnets 10A1 in the drive side becomes the magnetic force of a product obtained by multiplying the magnetic force of one first magnet 10A1 by the number of the first magnets 10A1 (six). The magnetic force of the whole second magnets 20A1 in the driven side becomes the magnet force of the product obtained by multiplying the magnet force of one second magnet 20A1 by the number of the second magnets 20A1 (six).

In the magnetic rotation transmitting device of the first embodiment as described above, there is a further important feature. That is, the adjacent and facing surfaces of the first magnets 10A1 adjacent to each other on the first disk 11A1 on the drive side are disposed so that the magnetic pole faces having same polarity make pairs, and the adjacent and facing surfaces of the second magnets 20A1 adjacent to each other on the second disk 21A1 on the driven side are disposed so that the magnetic pole faces having same polarity make pairs.

Because of the disposition by making pairs such as the N-magnetic magnetic pole and N-magnetic pole or the S-magnetic pole and S-magnetic pole, the magnetic force in a space where the same magnetic pole faces of the first magnets 10A1 of the drive side are allowed to be pairs (hereinafter, referred to as a "same-polarity magnetic field space") becomes stronger than the magnetic force in a normal space where magnetic pole faces different from each other are allowed to be pairs (hereinafter, referred to as a "different-polarity magnetic field space"). In the same way, the magnetic force in the space where the same magnetic pole faces of the first second magnets 20A1 in the driven side are allowed to be pairs ("same-polarity magnetic field space") becomes stronger than the magnetic force in the normal space where the magnetic pole faces different from each other are allowed to be pairs (hereinafter, referred to as a "different-polarity magnetic field space"). Hereinafter, such effect is referred to as "magnetic force reinforcing effect in the same-polarity magnetic field space". Thus, when the drive source (not shown) such as the electric motor is actuated to rotationally drive the driving rotation body, the same-polarity magnetic field space (N, N) in the first magnets 10A1 and the same-polarity magnetic field space (S, S) in the second magnets 20A1 having the driven rotation body are attracted to each other, and the adjacent same-polarity magnetic field space (S, S) in the driving rotation body and the adjacent same-polarity magnetic field space (N, N) in the driving rotation body are attracted to each other. In the same way as described above, all the same-polarity magnetic field space (S, S) or (N, N) in the driving rotation body can make a magnetic coupling relation attracted to each other between the corresponding same-polarity magnetic field space (S, S) or (N, N) of the driven rotation body.

As a result, in accordance with the rotational motion of the same-polarity magnetic field space in the first magnets 10A1 caused by the rotation of the driving rotation body, the same-polarity magnetic field space of the second magnets 20A1 is attracted, the driven rotation body starts rotating, and finally the driven rotation body rotates with the same speed as the driving rotation body.

Therefore, since the magnetic force reinforcing effect is added to the magnet line of the first magnets 10A1 and the magnet line of the second magnets 20A1 by a repulsive magnetic field having a high magnetic flux density generated in the same-polarity magnetic field space and by the opposed magnetic field spaces attracted to each other, there is an effect that torque transmitted to the driven side can be increased as the whole magnetic rotation transmitting device.

A rotation torque (transmitting torque) in the magnetic rotation transmitting device of the first embodiment can be represented by a following formula (1) when a value of torque is denoted as 'T' (unit: N·m, newton·meter), the thrust to a circumferential direction in the central position of magnet is denoted as 'f' (unit: N, Newton), a distance from the driving center line to the central position of the first magnet or a distance from the driven center line to the central position of the first magnet is denoted as 'r' (unit: m, meter), the number of the magnets is denoted as 'n' (unit: piece, dimensionless number) and coefficient showing a degree of increase and decrease of the magnetic force is denoted as 'k'.

$$T = f \times r \times n \times k \qquad (1)$$

A result of an experiment is a graph of FIG. 3, which is performed with respect to the magnetic rotation transmitting device as the one modification example of the first embodiment of the present invention shown in FIG. 2A to FIG. 2C. In the graph of FIG. 3, a horizontal axis represents an angle of the driving rotation body rotated and shifted with respect to the driven rotation body (displacement angle, unit: degree). A right vertical axis represents a torque value (unit: N·m) at that time. In the graph of FIG. 3, a graph G1 is, as the example of FIG. 2, a graph of the torque value with respect to the displacement angle in the case of the magnetic rotation transmitting device having the structure such that adjacent and facing surfaces of the first magnets 10A1 adjacent to each other on the first disk 11A1 in the drive side are disposed so that magnetic pole faces having same polarity make pairs, and adjacent and facing surfaces of the second magnets 20A1 adjacent to each other on the second disk 21A1 in the driven side are disposed so that magnetic pole faces having same polarity make pairs (hereinafter, referred to as a "same-polarity magnetic field type"). On the other hand, in the graph of FIG. 3, a graph G3, opposite to the example of FIG. 2, though not shown, a graph of the torque value with respect to the displacement angle in the case of the magnetic rotation transmitting device having the structure such that adjacent and facing surfaces of the first magnets 10A1 adjacent to each other on the first disk 11A1 in the drive side are disposed so that magnetic pole faces having different polarities make pairs, and adjacent and facing surfaces of the second magnets 20A1 adjacent to each other on the second disk 21A1 in the driven side are disposed so that magnetic pole faces having different polarities make pairs (hereinafter, referred to as a "different-polarity magnetic field type"). As a condition of the experiment, for the same-polarity magnetic field type magnets and the different-polarity magnetic field type magnets, the same magnets are used.

As can be seen from the comparison of the graphs G1 and G2 in FIG. 3, the case of G1 of the same-polarity magnetic field type magnetic rotation transmitting device can transmit almost twice as much torque as the case of the G2 of the different-polarity magnetic field type magnetic rotation transmitting device, from the drive side to the driven side. Therefore, according to the experiment, the value of the coefficient 'k' in the formula (1) is approximately 2.0.

A measurement of the thrust 'f' in the experiment of FIG. 3 is performed as follows. A piece of the first magnets 10A1 is picked up from the driving rotation body and a piece of the second magnets 20A1 is picked up from the driven rotation body. The first magnet 10A1 is fixed on an experiment table and the like, a spacer (gap keeping member) made of nonmagnetic materials for keeping the magnetic coupling gap is put thereon, and the second magnet 20A1 is further placed thereon. By doing this, the S-magnetic pole of the second magnet 20A1 is just above the N-magnetic pole of the first magnet 10A1 through the spacer, and they stopped in a state being attracted to each other. In a state that the second magnet 20A1 is horizontally displaced in a certain distance from the stopped state, a magnetic absorption turning back to the original position is measured by a spring balance and so on. Several times of measurement by changing the distance to be displaced (displaced distance) to obtain the thrust 'f'. If a radius of the disk is settled, the displaced distance is calculated by a product in which the radius value is multiplied by the displacement angle (unit: radian).

The first magnets 10A described above are fixed to the first disk 11A by means of an adhesive or a mechanical joining such as a bolt. Alternatively, the first disk 11A is made of aluminum and the like, concave portions (not shown) in which the first magnets 10A are housed with no space therebetween are formed in the first disk 11A in advance. After the first magnets 10A are put into the concave portions, an upper surface of the first disk 11A in a periphery of the concave portion is struck by a tool such as a chisel toward a direction of the first magnet. By doing this, the upper surface of the first disk 11A in the periphery of the first magnets 10A is plastic-deformed and covers the upper portion of first magnets 10A in such a state of "claws", as a result, the first magnets 10A are fixed to the first disk 11A by a "caulking". The process of fixing the second magnets 20A to the second disk 21A is similar to the above. By thus fixing the respective magnets by the caulking, the magnets can be prevented from being dropped out efficiently if a large repulsive magnetic force is operated. As another process of fixing the magnets (for example, 10A) to the disk (for example, 11A), it is possible to employ the process that the concave portions (not shown) in which the magnets are housed with no space therebetween are formed in the disk in advance, and after the magnets are put into the concave portions, a plate-shaped disk cover plate (not shown) made of nonmagnetic materials having approximately the same cross-sectional shape as the disk covers all the magnets and the disk cover plate is fixed to the disk by means of fixing members such as bolts or screws made of nonmagnetic material. Alternatively, it is possible to employ the process that the concave portions (not shown) in which the magnets are housed with no space therebetween are formed in the disk in advance, and after the magnets are put into the concave portions, plate-shaped magnet cover plates (not shown) made of nonmagnetic materials having larger cross-sectional shape than the planar shape of the magnet cover respective magnets and the respective magnet cover plates are fixed to the disk by means of fixing members such as bolts or screws made of nonmagnetic materials.

In the above first embodiment, the electric motor not shown corresponds to the drive source in claims. The magnetic rotation transmitting device having the structure of the above-described first embodiment is referred to as an "axial-type magnetic rotation transmitting device". Note that, in the "axial-type magnetic rotation transmitting device" described above, a structure replacing the drive side portion with the driven side portion is also referred to as the "axial-type magnetic rotation transmitting device".

Second Embodiment

The magnetic rotation transmitting device according to the present invention can be realized by a different structure from the aforementioned first embodiment. Hereinafter, a second embodiment of the present invention will be explained with reference to the drawings. FIG. 4A and FIG. 4B are views showing a structure of the magnetic rotation transmitting device as the second embodiment of the present invention.

Figure 4:
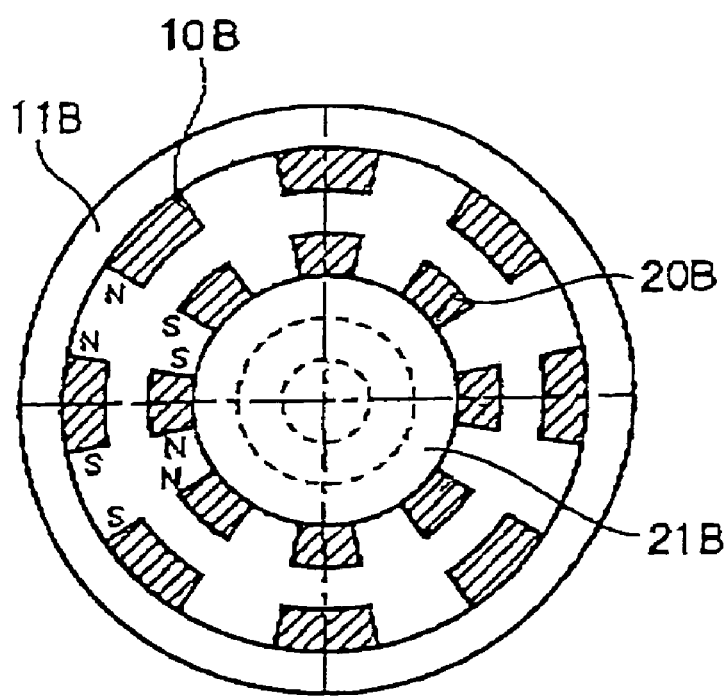
FIG. 4A and FIG. 4B are views showing a structure of a magnetic rotation transmitting device as a second embodiment of the present invention.
Figure 4:
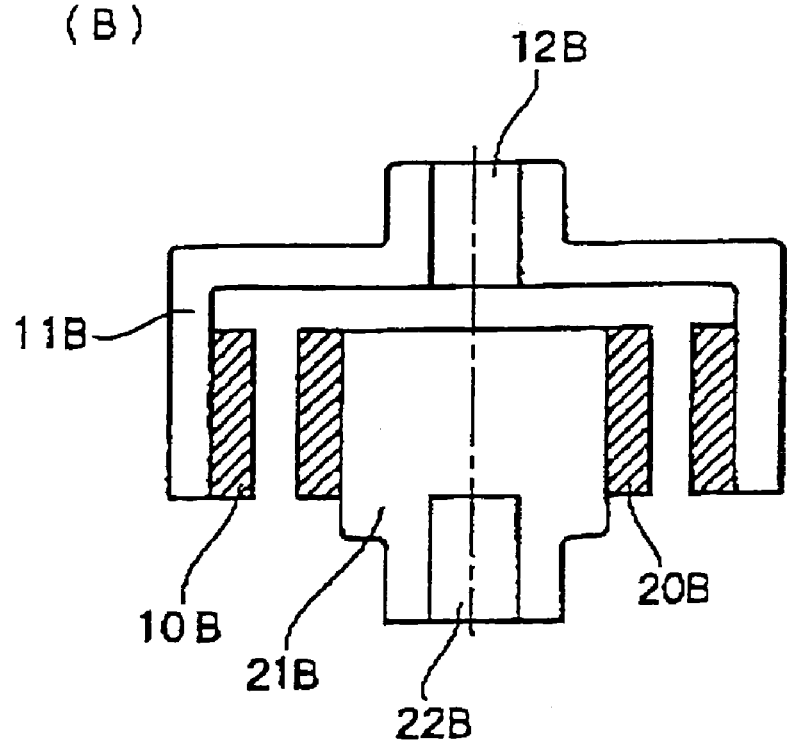

As shown in FIG. 4, the magnetic rotation transmitting device as the second embodiment of the present invention is constituted by including a driving rotation body having a cylinder 11B and first magnets 10B, and a driven rotation body having a column 21B and second magnets 20B.

The cylinder 11B is the member made of nonmagnetic materials similar to the case of the first embodiment, which is formed to be the cylindrical shape.

The first magnet 10B is a permanent magnet made of materials similar to the first embodiment, which is formed to be a columnar solid shape having a sector cross-sectional shape.

In the example of FIG. 4A, the eight first magnets 10B are disposed in an inner wall of the cylinder 11B in a circumferential direction at almost equal intervals. The eight first magnet 10B disposed side-by-side circumferentially correspond to one magnet line in claims. A planar shape of an individual first magnet 10B is approximately sectorial, and a center line of the sector practically overlaps with a nearly radial straight line running through the center of a circle of the cylinder 11B.

The aforementioned first magnet 10B has a N-magnetic pole portion denoted as a symbol 'N' in FIG. 4A and a S-magnetic pole portion denoted as a symbol 'S' in FIG. 4A. A boundary surface between the N-magnetic pole portion and the S-magnetic pole portion is allowed to approximately correspond to the center line of the sector formed by the first magnet 10B, and an extended surface of the boundary surface between the N-magnetic pole portion and the S-magnetic pole portion is disposed so as to practically overlap with, or practically contact a rotation center line of the driving rotation body (hereinafter, referred to as a "driving center line").

Adjacent and facing surfaces (side surfaces) of the two first magnets 10B, 10B adjacent to each other on the cylinder 11B are disposed so that magnetic pole faces having same polarity make a pair (one set). For example, the adjacent and facing surfaces of the two first magnets 10B, 10B adjacent to each other on the cylinder 11B are disposed so that a N-pole faces a N-pole, and a S-pole faces a S-pole. Hereinafter, the pair of the N-pole and the N-pole is denoted as (N, N) and the pair of the S-pole and the S-pole is denoted as (S, S).

At the center of the side opposite to the side where the first magnets 10B are disposed in the cylinder 11B, a mortise for a drive shaft 12B is provided (refer to FIG. 4B). A straight line connecting the center of the cylinder 11B to the center of the mortise for the drive shaft 12B approximately corresponds to the driving center line of the driving rotation body. A drive shaft (not shown) of a drive source such as an electric motor (not shown) can be fitted to the mortise for the drive shaft 12B, and the driving rotation body is allowed to be rotationally driven by the drive source. In this case, the rotation center line approximately corresponds to the driving center line.

The column 21B is the member made of nonmagnetic materials similar to the case of the first embodiment, which is formed to be the columnar shape.

The second magnet 20B is a permanent magnet made of materials similar to the first embodiment, which is formed to be a columnar solid shape having a sector cross-sectional shape.

In the example of FIG. 4A, the eight second magnets 20B as the same number as the first embodiment are disposed in an outer wall of the column 21B in a circumferential direction at almost equal intervals. The eight second magnet 20B disposed side-by-side circumferentially correspond to one magnet line in claims. A planar shape of an individual second magnet 20B is approximately sectorial, and a center line of the sector practically corresponds to a nearly radial straight line running through the center of a circle of the column 21B.

An disposition state of the second magnets 20B (intervals between adjacent second magnets, differences of the central angle between adjacent second magnets or the like) is set to be similar to, or analogous to the disposition state of the first magnets 10B (intervals between adjacent first magnets, differences of the central angle between adjacent first magnets or the like).

Therefore, the second magnet 20B, though a planar disposition state thereof is not shown, has the N-magnetic pole portion and the S-magnetic pole portion in the same way as the case of the first magnet 10B, disposed such that an extended surface of the boundary surface between the N-magnetic pole portion and the S-magnetic pole portion practically overlaps with, or practically contacts a rotation center line of the driving rotation body (hereinafter, referred to as a driven center line).

In the same way as the case of the first magnet 10B, though not shown, adjacent and facing surfaces (side surfaces) of the two second magnets 20B, 20B adjacent to each other on the column 21B are disposed so that magnetic pole faces having same polarity make a pair (one set). For example, the adjacent and facing surfaces of the two second magnets 20B, 20B adjacent to each other on the column 21B are disposed so that a N-pole faces a N-pole, and a S-pole faces a S-pole, namely, such as (N, N) and (S, S).

At the center of the side opposite to the side where the second magnets 20B are disposed in the column 21B, a mortise for a drive shaft 22B is provided (refer to FIG. 4B). A straight line connecting the center of the column 21B to the center of the mortise for the drive shaft 22B approximately corresponds to the driven center line of the driven rotation body.

As shown in FIG. 4B, a predetermined gap (hereinafter referred to as "magnetic coupling gap") is set between an outer surface of the first magnet 10B and an outer surface of the second magnet 20B. As an attachment process or a fixing process of respective magnets to the cylinder or the column in the magnetic rotation transmitting device of the second embodiment, similar processes to the case of the aforementioned first embodiment can be employed. Concerning a securing process for the magnetic coupling gap, a similar process to the case of the first embodiment can also be employed.

Also in the case of the magnetic rotation transmitting device of the second embodiment, a magnetic force in a space where the same magnetic pole faces of the first magnets 10B in the drive side are allowed to be pairs ("same-polarity magnetic field space") becomes stronger than the magnetic force of the normal magnetic pole, and magnetic force in a space where the same magnetic pole faces of the second magnets 20B in the driven side are allowed to be the pair ("same-polarity magnetic field space") also becomes stronger than the magnetic force of the normal magnetic pole. In addition, the first magnets 10B and the second magnets 20B are plural and same in number. Therefore, even if the magnetic force of one first magnet 10B or one second magnet 20B is same as usual, in the whole first magnets 10B in the drive side, a magnetic force reinforcing effect obtained by allowing the same magnetic-pole faces to be pairs as described above (magnetic force reinforcing effect by the same polarity magnetic field space) is added to the magnetic force of a product obtained by multiplying the magnetic force of one first magnet 10B by the number of the first magnets 10B, at the same time, in the whole second magnets 20B in the driven side, the magnetic force reinforcing effect obtained by allowing the same magnetic pole faces to be the pair as described above is added to the magnetic force of a product obtained by multiplying the magnetic force of one second magnet 20B by the number of the second magnets 20B. As a whole magnetic rotation transmitting device, a transmitting torque to the driven side can be almost twice as much as the usual case.

In the aforementioned second embodiment, the not-shown electric motor corresponds to the drive source in claims. Additionally, the magnetic rotation transmitting device having the structure such as the aforementioned second embodiment is referred to as a "radial-type magnetic rotation transmitting device".

Third Embodiment

Figure 5:
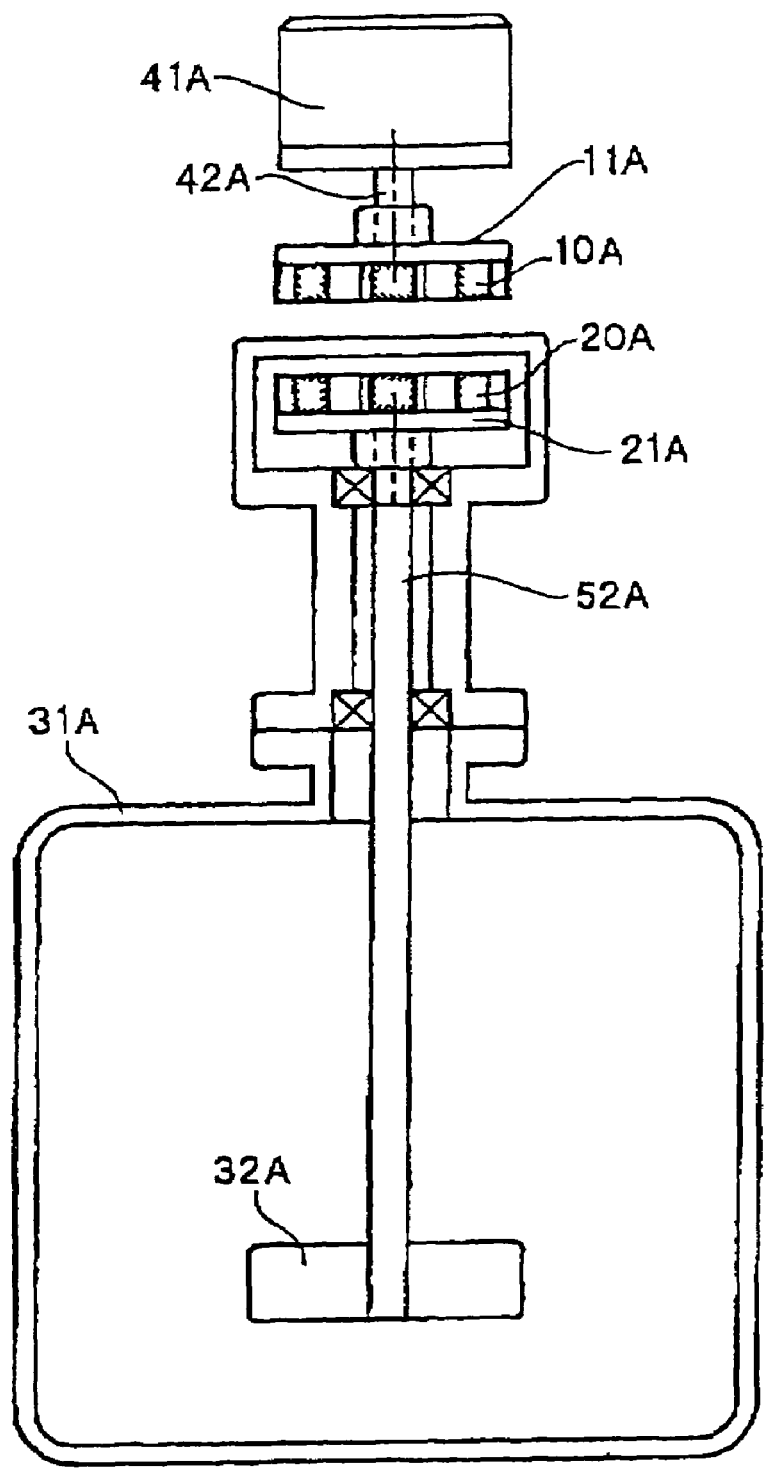
FIG. 5 is a view showing a structure of a hermetic stirring unit as a third embodiment of the present invention.

Hereinafter, a third embodiment of the present invention will be explained with reference to the drawing. FIG. 5 is a view showing a structure of a hermetic stirring unit as being the third embodiment of the present invention. As shown in FIG. 5, the a hermetic stirring unit of the third embodiment of the present invention is constituted by including an axial-type magnetic rotation transmitting device, an electric motor 41A, a hermetic container 31A, a stirring blade 32A, and a driven shaft 52A.

Since the axial-type magnetic rotation transmitting device is the device having the same structure and operation as the magnetic rotation transmitting device of the first embodiment shown in FIG. 1, the explanation thereof is omitted. The hermetic container 31A, especially in the vicinity of the magnetic rotation transmitting device, is made of materials which are not magnetized or which do not tend to be magnetized (nonmagnetic materials), for example, nonmagnetic metal materials (such as an austenitic stainless steel, an aluminum alloy), a an FRP (fiber reinforced plastic) and the like. The hermetic container 31A is hollow and has no opening as a whole, and a stirring tank portion thereof is a member formed to be various hollow solid shape such as hollow barrel bodies (for example, a hollow cylindrical body, hollow elliptic barrel body, a hollow square barrel body, a hollow polygonal barrel body or the like), a hollow spherical body, a hollow rotation elliptic body and the like.

In the hermetic stirring unit of the third embodiment of the present invention, a drive shaft 42A of the electric motor 41A is fitted to the mortise for the drive shaft 12A of the magnetic rotation transmitting device of the first embodiment shown in FIG. 1B to allow the shaft to be rotationally driven. In the hermetic stirring unit of the third embodiment of the present invention, a driven shaft 52A is fitted to the mortise for the driven shaft 22A of the magnetic rotation transmitting device of the first embodiment shown in FIG. 1B.

A radial stirring blade 32A is attached to an lower end of the driven shaft 52A in the drawing. Note that, among the above components, the stirring blade 32A, the driven shaft 52A, the second disk 21A and the second magnets 20A of the magnetic rotation transmitting device, are housed inside the hermetic container 31A in a hermetic state.

Inside the hermetic container 31A, a substance which can not be stirred except in the hermetic state, the substance which is stirred under a condition of high-temperature or high-pressure environment, or under the a vacuum condition (hereinafter, referred to as a "substance to be stirred") and so on are sealed. The hermetic container 31A is composed of at least two portions (these portions have at least one opening respectively), and hermetically sealed by a bolt or sealant and the like. After the stirring of the substance to be stirred is finished, the hermetic container 31A is disassembled into two portions in another hermetic box and the like (not shown), and the stirred substance of the inside can be taken out from the aforementioned opening.

According to the structure as described above, when the electric motor 41A is actuated and the driving rotation body of the magnetic rotation transmitting device is rotationally driven, in accordance with a rotational motion of the first magnets 10A with the rotation of the driving rotation body, the second magnets 20A are attracted, and the driven rotation body inside the hermetic container 31A also starts rotating, the stirring blade 32A inside the hermetic container 31A is rotated, as a result, the substance to be stirred in the hermetic container 31A can be stirred.

In the aforementioned third embodiment, the electric motor 41A corresponds to the drive source in claims.

Fourth Embodiment

Figure 6:
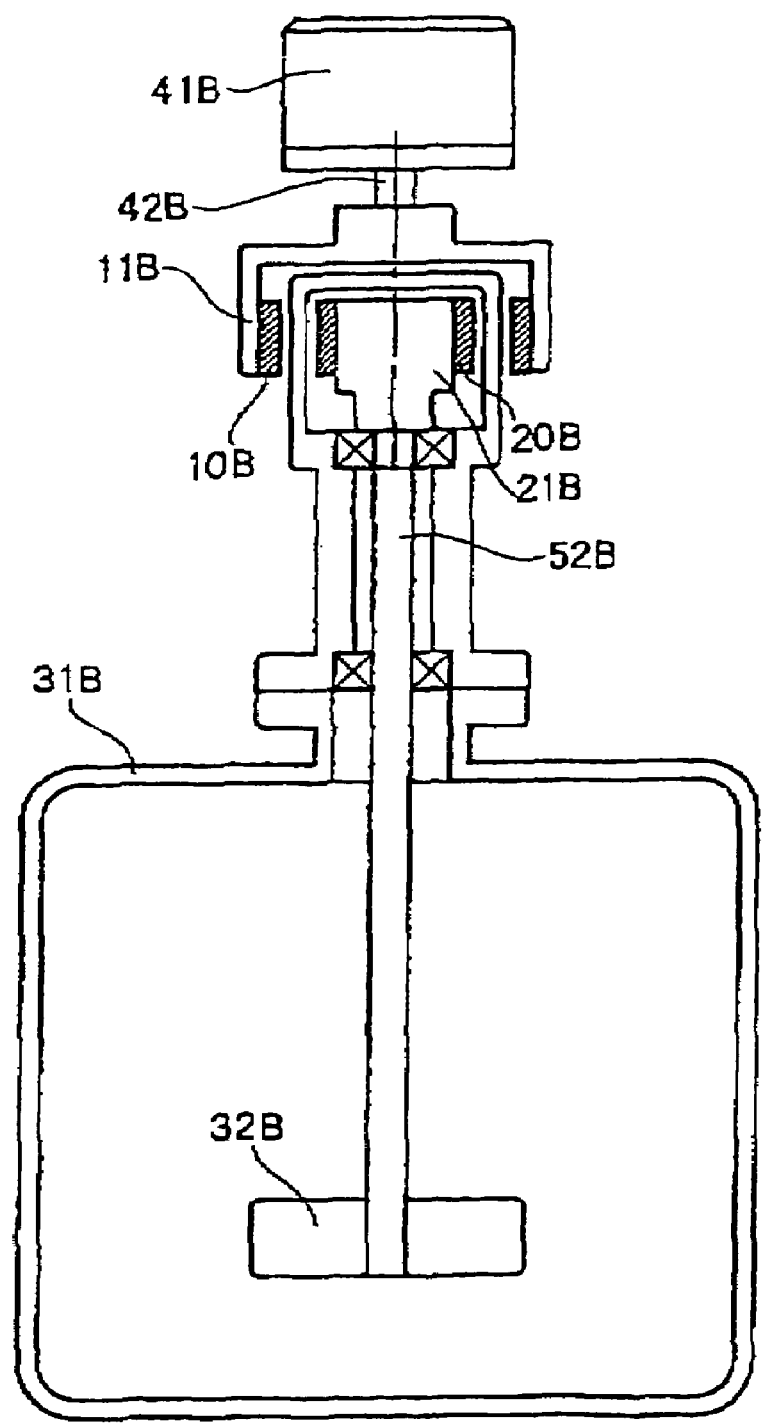
FIG. 6 is a view showing a structure of a hermetic stirring unit as a fourth embodiment of the present invention.

Hereinafter, a fourth embodiment of the present invention will be explained with reference to the drawing. FIG. 6 is a view showing a structure of a hermetic stirring unit as being the fourth embodiment of the present invention. As shown in FIG. 6, the hermetic stirring unit of the fourth embodiment of the present invention is constituted by including a radial-type magnetic rotation transmitting device, an electric motor 41B, a hermetic container 31B, a stirring blade 32B and a driven shaft 52B.

Since the radial-type magnetic rotation transmitting device is the device having the same structure and operation as the magnetic rotation transmitting device of the second embodiment shown in FIG. 4, the explanation thereof is omitted. Additionally, since materials and shapes of the hermetic container 31B are similar to the hermetic container 31A, the explanation thereof is omitted.

In the hermetic stirring unit of the fourth embodiment of the present invention, a drive shaft 42B of the electric motor 41B is fitted to a mortise for the drive shaft 12B of the magnetic rotation transmitting device of the second embodiment shown in FIG. 4B to allow the shaft to be rotationally driven. In the hermetic stirring unit of the fourth embodiment of the present invention, a driven shaft 42B is fitted to the mortise for the driven shaft 22B of the magnetic rotation transmitting device of the second embodiment shown in FIG. 4B.

A radial stirring blade 32B is attached to an lower end of the driven shaft 52B in the drawing. Note that, among the above components, the stirring blade 32B, the driven shaft 52B, the column 21B and the second magnets 20B of the magnetic rotation transmitting device, are housed inside the hermetic container 31B in a hermetic state.

Inside the hermetic container 31B, a substance to be stirred similar to the case of the hermetic container 31A are sealed. The hermetic container 31B is composed of at least two portions (portions having at least one opening respectively), and hermetically sealed by a bolt or sealant and the like. After the stirring of the substance to be stirred is finished, the hermetic container 31B is disassembled into two portions in another hermetic box and the like, and the stirred substance of the inside can be taken out from the aforementioned opening.

According to the structure as described above, when the electric motor 41B is actuated and the driving rotation body of the magnetic rotation transmitting device is rotationally driven, in accordance with a rotational motion of the first magnets 10B with the rotation of the driving rotation body, the second magnets 20B are attracted, and the driven rotation body inside the hermetic container 31B also starts rotating, the stirring blade 32B inside the hermetic container 31B is rotated, as a result, the substance to be stirred in the hermetic container 31B can be stirred.

In the aforementioned fourth embodiment, the electric motor 41B corresponds to the drive source in claims.

Fifth Embodiment

Figure 7:
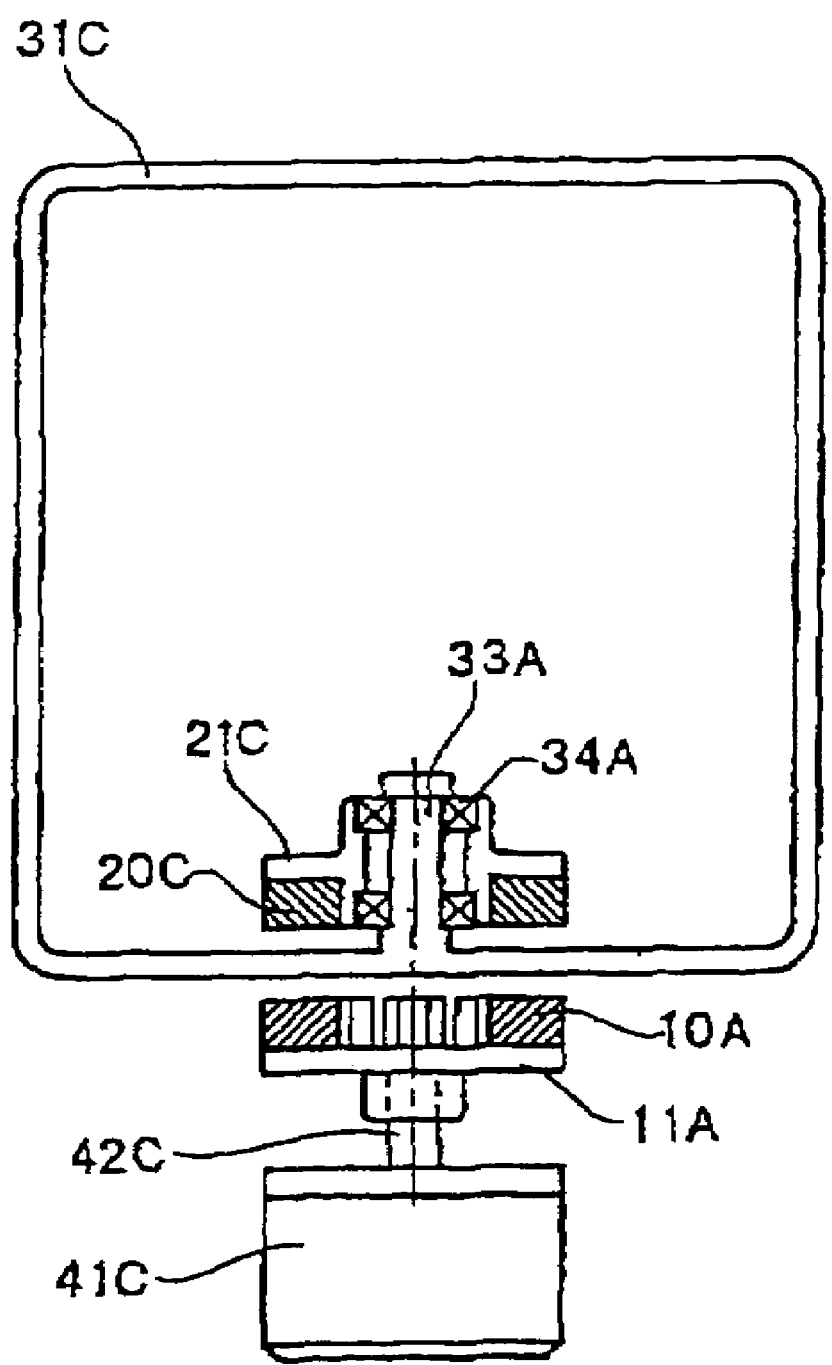
FIG. 7 is a view showing a structure of a hermetic stirring unit as a fifth embodiment of the present invention.

Hereinafter, a fifth embodiment of the present invention will be explained with reference to the drawing. FIG. 7 is a view showing a structure of a hermetic stirring unit as being the fifth embodiment of the present invention. As shown in FIG. 7, the hermetic stirring unit of the fifth embodiment of the present invention is constituted by including an axial-type magnetic rotation transmitting device, an electric motor 41C, a hermetic container 31C, a fixing shaft 33A, and bearing members 34A. Since materials and shapes of the hermetic container 31C are similar to the above-mentioned hermetic container 31A, the explanation thereof is omitted.

The axial-type magnetic rotation transmitting device is constituted by including a driving rotation body having a first disk 11A and first magnets 10, and a driven rotation body having a second disk 21C and second magnets 20C, that is, the device having approximately the same structure and operation as the magnetic rotation transmitting device of the first embodiment shown in FIG. 1. Different points of the axial-type magnetic rotation transmitting device shown in FIG. 7 from the magnetic rotation transmitting device of the first embodiment in FIG. 1 are that a driven-shaft through hole as being a through hole of a circular section formed so as to include a driven center line of the driven rotation body is provided, and that the fixing shaft 33A is inserted through the driven-shaft through hole and the driven rotation body is attached so as to be rotatable through the bearing members 34A. The fixing shaft 33A is a columnar part provided protrudingly from a bottom surface of the inside of the hermetic container 31A. The bearing members 34A is a member facilitating rotation by allowing rotation friction of the shaft to be decreased, which includes a ball bearing and is disposed around the fixing shaft 33A.

In the hermetic stirring unit of the fifth embodiment of the present invention, a drive shaft 42C of the electric motor 41C is fitted to a mortise for the drive shaft 12A of the magnetic rotation transmitting device of the first embodiment shown in FIG. 1B to allow the shaft to be rotationally driven. In the hermetic stirring unit of the fifth embodiment of the present invention, a stirring blade not shown is attached to the driven rotation body.

Note that, among the above components, the second disk 21C, the second magnets 20C, the bearing members 34A and the fixing shaft 33A of the magnetic rotation transmitting device are housed inside the hermetic container 31C in hermetic state.

Inside the hermetic container 31C, a substance to be stirred similar to the case of the hermetic container 31A are sealed. The hermetic container 31C is composed of at least two portions (portions having at least one opening respectively), and hermetically sealed by a bolt or sealant and the like. After the stirring of the substance to be stirred is finished, the hermetic container 31C is disassembled into two portions in another hermetic box and the like, and the stirred substance of the inside can be taken out from the aforementioned opening.

According to the structure as described above, when the electric motor 41C is actuated and the driving rotation body of the magnetic rotation transmitting device is rotationally driven, in accordance with a rotational motion of the first magnets 10A with the rotation of the driving rotation body, the second magnets 20C are attracted, and the driven rotation body inside the hermetic container 31C also starts rotating, the stirring blade inside the hermetic container 31C (for example, an not-shown additional stirring blade attached to the driven rotation body, or the second magnets 20C themselves) is rotated, as a result, the substance to be stirred in the hermetic container 31C can be stirred.

In the aforementioned fifth embodiment, the electric motor 41C corresponds to the drive source in claims.

Sixth Embodiment

Figure 8:
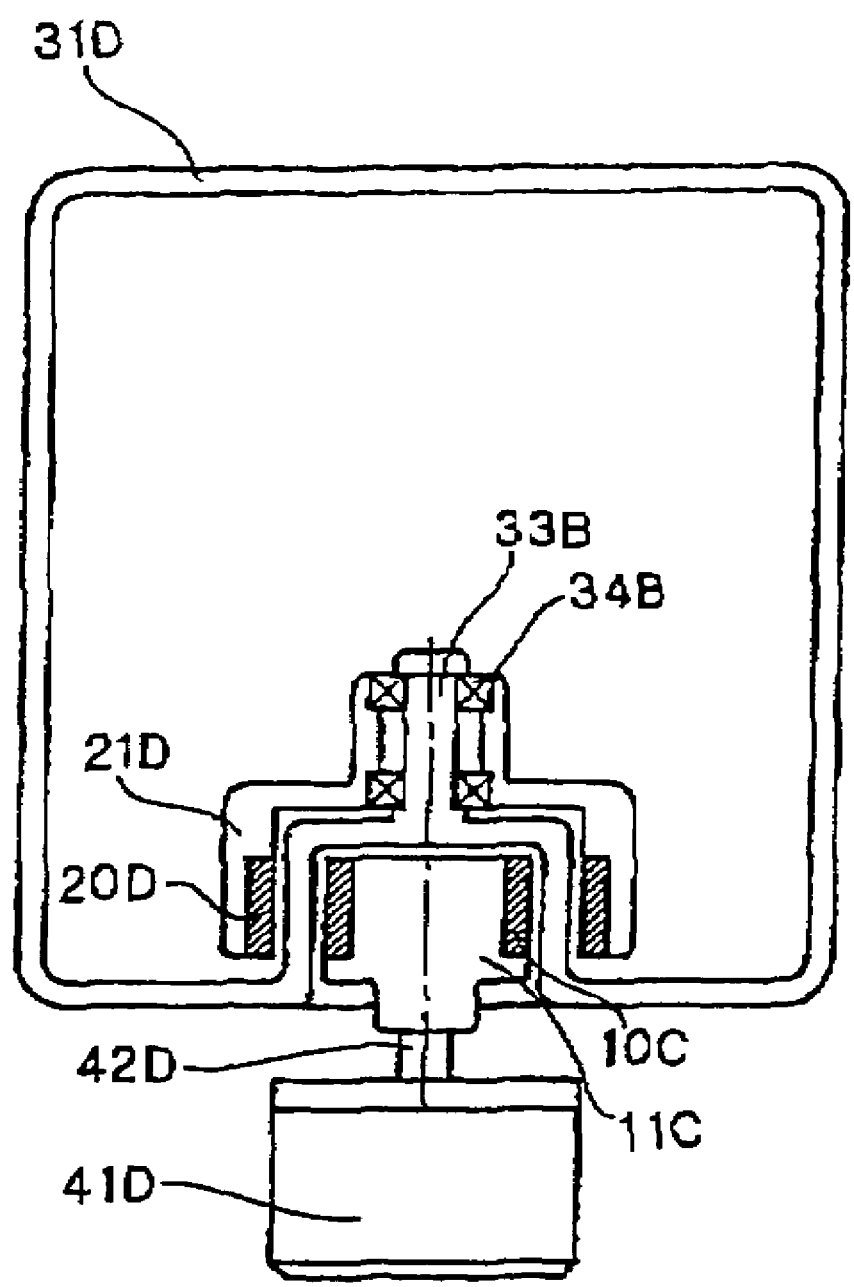
FIG. 8 is a view showing a structure of a hermetic stirring unit as a sixth embodiment of the present invention.

Hereinafter, a sixth embodiment of the present invention is explained with reference to the drawing. FIG. 8 is a view showing a structure of a hermetic stirring unit of the sixth embodiment of the present invention. As shown in FIG. 8, the hermetic stirring unit of the sixth embodiment of the present invention is constituted by including an radial-type magnetic rotation transmitting device, an electric motor 41D, a hermetic container 31D, a fixing shaft 33B, and bearing members 34B. Since materials and shapes of the hermetic container 31D are similar to the above-mentioned hermetic container 31A, the explanation thereof is omitted.

The radial-type magnetic rotation transmitting device is the device having different structure and operation from the magnetic rotation transmitting device of the second embodiment shown in FIG. 4. Different points of the radial-type magnetic rotation transmitting device shown in FIG. 8 from the magnetic rotation transmitting device of the second embodiment in FIG. 4 are that a driving rotation body is a inside column 11C (first magnets 10C are provided along a circumference of an outer surface thereof), that a driven rotation body is an outer cylinder 21D (second magnets 20D are provided along the circumference of an inner surface thereof), that a driven-shaft through hole as being a through hole of a circular section formed so as to include the driven center line of the driven rotation body is provided, and that the fixing shaft 33B is inserted into the driven-shaft through hole and the driven rotation body is attached so as to be rotatable through the bearing members 34A. The fixing shaft 33B is a columnar part provided protrudingly from a bottom surface of the inside of the hermetic container 31D. The bearing members 34B is a member facilitating rotation by allowing rotation friction of the shaft to be decreased, which includes a ball bearing and is disposed around the fixing shaft 33B. As an attachment process or a fixing process of respective magnets to the column or the cylinder in the magnetic rotation transmitting device used for the hermetic stirring unit of the sixth embodiment, similar processes to the case of the aforementioned first embodiment can be employed.

In the hermetic stirring unit of the sixth embodiment of the present invention, a drive shaft 42D of the electric motor 41D is fitted to a mortise for the drive shaft (not shown) provided at a lower part of the column 11C to allow the shaft to be rotationally driven. In the hermetic stirring unit of the sixth embodiment of the present invention, a stirring blade not shown is attached to the driven rotation body.

Note that, among the above components, the cylinder 21D, the second magnets 20D, the bearing members 34B and the fixing shaft 33B of the magnetic rotation transmitting device are housed inside the hermetic container 31D in hermetic state.

Inside the hermetic container 31D, a substance to be stirred similar to the case of the hermetic container 31A are sealed. The hermetic container 31D is composed of at least two portions (portions having at least one opening respectively), and hermetically sealed by a bolt or sealant and the like. After the stirring of the substance to be stirred is finished, the hermetic container 31D is disassembled into two portions in another hermetic box and the like, and the stirred substance of the inside can be taken out from the aforementioned opening.

According to the structure as described above, when the electric motor 41D is actuated and the driving rotation body of the magnetic rotation transmitting device is rotationally driven, in accordance with a rotational motion of the first magnets 10C with the rotation of the driving rotation body, the second magnets 20D are attracted, and the driven rotation body inside the hermetic container 31D also starts rotating, the stirring blade inside the hermetic container 31D (for example, an not-shown additional stirring blade attached to the driven rotation body, or an outer side of the cylinder 21D) is rotated, as a result, the substance to be stirred in the hermetic container 31D can be stirred.

In the aforementioned sixth embodiment, the electric motor 41D corresponds to the drive source in claims.

The present invention does not limited to the aforementioned embodiments. Each embodiment described above is an exemplification, and anything having practically the same structure as the technical idea as set forth in claims of the present invention and anything performing similar operation and effect will be included in the technical scope of the present invention.

For example, the magnetic transmitting device in the hermetic stirring unit shown in FIG. 7 and the magnetic transmitting device in the hermetic stirring unit shown in FIG. 8 can be used by themselves.

Additionally, the magnetic transmitting device in the hermetic stirring unit shown in FIG. 8 is not installed to the fixing shaft 33B but the driven shaft 52A or 52B, and a stirring blade 32A or 32B as shown in FIG. 5 or FIG. 6 are installed to the magnetic transmitting device in the hermetic stirring unit shown in FIG. 8 to compose the hermetic stirring unit.

Furthermore, the stirring blade (for example, 32A) can be installed to a sidewall inside the hermetic container, besides being provided at the bottom inside the hermetic container (for example, 31A). The stirring blade can also installed to a ceiling surface inside the hermetic container. In the hermetic stirring unit, two or more stirring blades and magnetic rotation transmitting devices for the blades can be provided.

Seventh Embodiment

Figure 9:
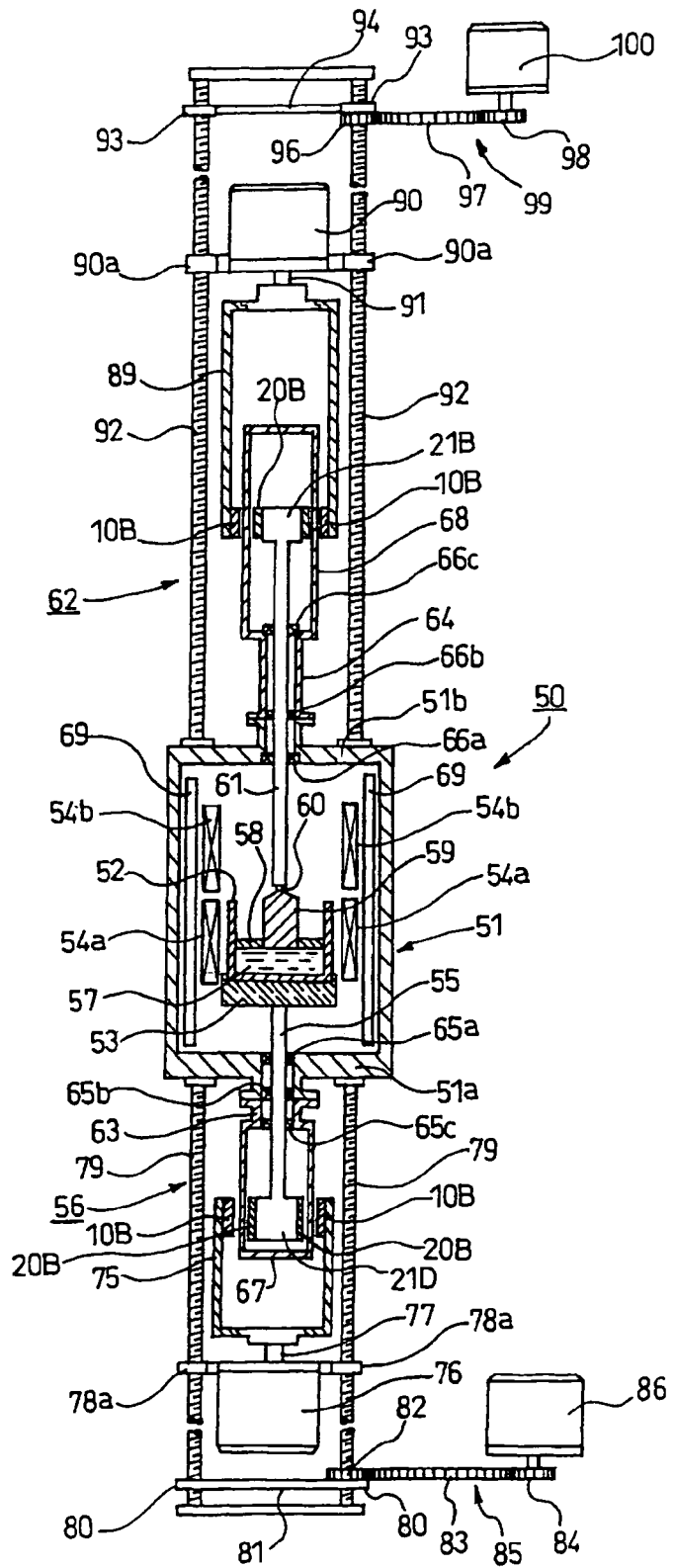
FIG. 9 is a view showing a structure of an electric furnace as a seventh embodiment of the present invention.

Next, a seventh embodiment of the present invention will be described. FIG. 9 shows an electric furnace 50 for pulling a single crystal such as a III-V group compound, as the seventh embodiment of the present invention.

As this kind of the III-V group compound deemed to be semiconductor materials such as GaAs, GaP, InP, and InAs, a so-called a Czochralski method (LEC method) is known, in which a molten composition of GaAs, GaP, or InP and the like is formed in a crucible installed inside a pressure-resistant vessel by combining gallium (Ga) and arsenic (As), gallium (Ga) and phosphorus (P), or indium (In) and phosphorus (P), and a seed crystal attached to a tip of a pulling shaft is dipped into the molten composition, then, a single crystal is pulled up with the crucible and the seed crystal rotated to allow the single crystal such as GaAS, GaP or InP to grow in a circumferential direction or an axial direction to obtain an ingot.

It is well know that, in such case, since elements such as Ga or In of V group are nonvolatile components, whereas element such as A or P of II group are volatile components having a vapor pressure exponentially increasing with the rise of the temperature, As or P is vaporized by the temperature increase caused by the heating when combined or when the single crystal is pulled, as a result, there causes the generation of lattice defects or excessive gallium, and a good-quality single crystal in which the volatile component and the non volatile component are in a proportion of one to one can hardly be obtained. Especially in the case of phosphorus (P), the above-described problem is more serious because the vapor pressure thereof is higher than the one of arsenic (As). Furthermore, as ZnSe, ZnS, CdTs, CdTe, HgTe and the like as being II-IV group compounds other than the III-V group compounds, the same problem occur in the case of Zn, Cd and the like as being the volatile components of II group.

In addition, when the compound is combined or when the single crystal is pulled up, the compound is apt to combine with other elements especially in the pressure-resistant vessel, therefore, it is performed that the inside of the pressure-resistant vessel is allowed to be a high-pressure inert gas atmosphere by vacuumizing the inside of the pressure-resistant vessel to be vacuumized and introducing the inert gas such as nitrogen, argon or the like thereinto.

From the above reason, the electric furnace for manufacturing the aforementioned III-V group, or II-IV group compounds requires a high hermeticity, therefore, a magnetic rotation transmitting device not reducing the hermeticity of the pressure-resistant vessel is required for a rotational drive transmitting device which rotationally driving the aforementioned crucible or the pulling shaft of the single crystal.

According to FIG. 9, an article denoted by an indicating numeral 51 is a pressure-resistant vessel made of, for example, stainless steel which is heat resistant, and in the axial direction of the central portion thereinside, a crucible 52 made of, for example, graphite is placed and fixed on a crucible placing table 53. Lower heating elements 54a made of, for example, carbon, are provided around the crucible 52. A supporting shaft 55 is attached to the crucible placing table 53 and extends into a lower hermetic barrel unit 67 of a magnetic rotation transmitting device 56 installed hermetically to a bottom lid 51a, piercing through the bottom lid 51a of the pressure-resistant vessel 51.

Inside the crucible 52, a molten composition 57 of, for example, GaAs, is contained, which is covered with a liquid sealant 58 such as B2O3 (boron oxide) on the top thereof, and a single crystal 59 grown from a seed crystal 60 is pulled up from the molten composition 57, rotating in one direction. In order to form a temperature gradient around the single crystal 59, upper heating elements 54b are provided therearound. The seed crystal 60 is fixed to a tip of a pulling shaft 61 of the single crystal, and the pulling shaft 61 extends into an upper hermetic barrel unit 68 of a magnetic rotation transmitting device 62 installed hermetically to a top lid 51b, piercing through the top lid 51b of the pressure-resistant vessel 51.

Between the crucible supporting shaft 55 and the pulling shaft 61 respectively piercing through the bottom lid 51a and the top lid 51b, and a lower guide barrel unit 63 and an upper guide barrel unit 64 guiding the crucible supporting shaft 55 and the pulling shaft 61, lower bearing devices 65a, 65b, and 66c, and upper bearing devices 66a, 66b, and 66c are provided. Note that the number of the bearing devices does not limited.

The aforementioned magnetic rotation transmitting device 56 rotating the crucible 52 is the radial-type one of the second embodiment shown in FIG. 4, and the second rotation column 21D and the second magnets 20B provided at the crucible supporting shaft 55 are housed in the lower hermetic barrel unit 67 hermetically installed to the lower guide barrel unit 63. To an outer side of the lower hermetic barrel unit 67, first magnets 10B of the aforementioned second embodiment are attached facing the second magnets 20B, the second magnets 20B are attached inside a cylinder 75, and the cylinder 75 is connected to a rotating shaft 77 of a drive motor 76 for rotating the crucible supporting shaft 55. The drive motor 76 is screwed to threaded rods 79, 79 hanging from the bottom lid 51a of the pressure-resistant vessel 51 at attachment portions thereof 78a, 78a. The threaded rods 79, 79 are rotated by a drive motor 86 through a drive force transmitting means 85 composed of, for example, pulleys 80, 80 over which a timing belt 81 is suspended, gears 82, 83, 84 and the like to move the cylinder 75 in upper and lower directions together with the drive motor 76. Articles denoted by an indicating numeral 69 in the pressure-resistant vessel 51 are heat insulators.

According to the above-described structure, when the drive motors 76, 86 are rotated, the first magnets 10B rotate or move in the upper and lower directions, subsequently to this, the second magnets rotate or move in the upper and lower directions, therefore, the crucible 52 is allowed to rotate or to be moved in the upper and lower directions on the crucible placing table 53 in the pressure-resistant vessel 51.

The aforementioned magnetic rotation transmitting device 62 rotating the pulling shaft 61 is the radial-type one of the second embodiment shown in FIG. 4, and the second rotation column 21B and the second magnets 20B provided at the pulling shaft 61 are housed in the upper hermetic barrel unit 68 hermetically attached to the upper guide barrel unit 64. To an outer side of the lower hermetic barrel unit 68, the first magnets 10B of the aforementioned second embodiment are attached facing the second magnets 20B, the second magnets 20B are attached inside a cylinder 89, and the cylinder 89 is connected to a rotating shaft 91 of a drive motor 90 for rotating the pulling shaft 61. The drive motor 90 is screwed to threaded rods 92, 92 standing on the top lid 51b of the pressure-resistant vessel 51 at attachment portions 90a, 90a. The threaded rods 92, 92 are rotated by a drive motor 100 through a drive force transmitting means 99 composed of, for example, pulleys 93, 93 over which a timing belt 94 is suspended, gears 96, 97, 98 and the like to move the cylinder 89 in the upper and lower directions together with the drive motor 90.

According to the above-described structure, when the drive motors 90, 100 are rotated, the first magnets 10B rotate or move in the upper and lower directions, subsequently to this, the second magnets rotate or move in the upper and lower directions, therefore, the pulling shaft 61 and the seed crystal 60 are allowed to rotate or to be moved in the upper and lower directions in the crucible 52 of the pressure-resistant vessel 51. Accordingly, the GsAs single crystal 59 having no impurity and very few lattice defects is manufactured in a pressure atmosphere in which no impurity is contained and the inert gas is stable.

Eighth Embodiment

Figure 10:
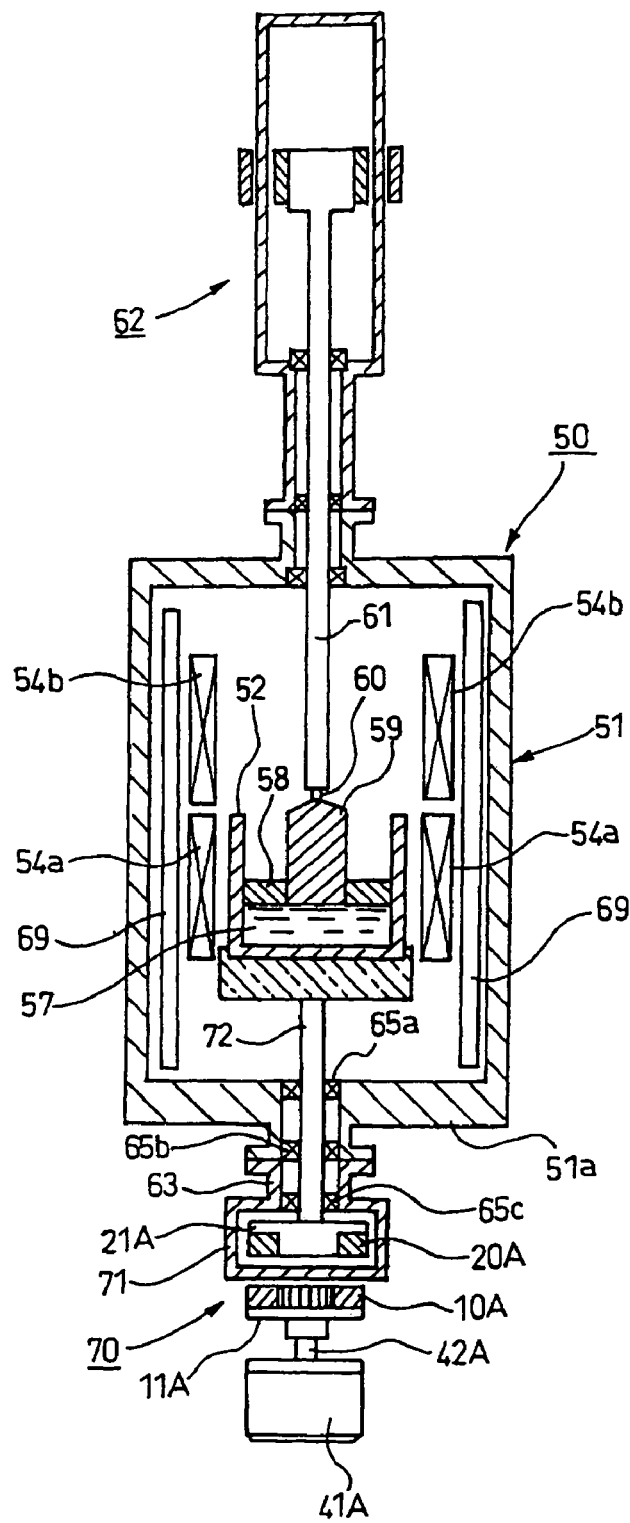
FIG. 10 is a view showing a structure of an electric furnace as a eighth embodiment of the present invention.

Next, an eighth embodiment of the present invention will be explained. FIG. 10 is a modification example of the seventh embodiment shown in FIG. 9. As shown in the drawing, in the case of a structure not performing a raising and lowering movement of a crucible 52 and just allowing the crucible to be rotated, an axial-type magnetic rotation transmitting device 70 shown in the aforementioned first embodiment of FIG. 1 can be applied to rotate a crucible supporting shaft 72.

The axial-type magnetic rotation transmitting device 70 will be described as follows. According to FIG. 10, a second rotation disk 21A and second magnets 20A provided at an lower end portion of a crucible supporting shaft 72 are housed inside an lower hermetic barrel unit 71 hermetically installed to a bottom lid 51a of a pressure-resistant vessel 51.

To an outside of the lower hermetic barrel unit 71, first magnets 10A fixed to a first rotation disk 11A attached to a rotating shaft 42A of an electric motor 41A are installed facing the second magnets 20A through the lower hermetic barrel unit 71.

According to the aforementioned structure, when the electric motor 41A is actuated and the first rotation disk 11A of the magnetic rotation transmitting device 70 is rotationally driven, the second magnets 20A are attracted in accordance with a rotational motion of the first magnets 10A with the rotation of the rotation disk 11A, the crucible supporting shaft 72 of the pressure resistant vessel 51 also start rotating, as a result, the crucible 52 in an electric furnace 1 is rotated.

In the above-described seventh and eighth embodiments, as a method for forming a molten composition such as GaAs in the crucible 52, there exist a case that a polycrystal such as GaAs is allowed to be melted and a case that elements themselves of Ga and As are allowed to be taken in the crucible 52 and combined by heating.

The inside of the pressure-resistant vessel 51 is under a high-pressure inertia gas atmosphere such as nitrogen (N2) or argon (Ar), however, there is a method for prevent As or P from dissociating by covering the periphery of the crucible 52 with another hermetic container not shown and by allowing the inside of the hermetic container to be the vapor pressure exceeding a dissociation pressure of the volatile component such as As or P. In the latter case, the outside of the hermetic container is controlled to be the high-pressure inertia gas atmosphere described above.

The magnetic rotation transmitting device 62 of the eighth embodiment shown in FIG. 10 is not shown in detail but has the same structure as the seventh embodiment of FIG. 9. The structure of the magnetic rotation transmitting device 62 does not limited to the one shown in FIG. 9 and other well-known structure can be applied.

Another structure different from the above-described respective embodiments is preferable, in which, for example, plural lines (magnet lines) are provided, in which plural first magnets as being permanent magnets are concentrically disposed in a circumferential direction at almost equal intervals on a disk, a cylinder or a column in a drive side driven by a drive source, plural lines (magnet lines) are provided, in which second magnets of the same numbers as the first magnets as being permanent magnets are concentrically disposed in the circumferential direction at almost equal intervals in the position corresponding to respective magnet lines of the drive side on a disk, a cylinder or a column in a driven side disposed facing the disk and the like of the drive side, a magnetic coupling gap is provided between the first magnets and the second magnets, adjacent and facing surfaces of the first magnets adjacent to each other on the disk and the like of the drive side are disposed so that magnetic pole faces having the same polarity make pairs, and adjacent and facing surfaces of the second magnets adjacent to each other on the disk and the like in the driven side are disposed so that the magnetic pole faces having the same polarity make pairs. In the case that plural magnet lines are provided on a surface of the disk, lines along which respective magnetic lines run are concentric with the center of the disk. In the case that plural magnet lines are provided to an outer surface of the column, or provided to an inner surface of the cylinder, lines along which respective magnetic lines run are plural circumferences having approximately the same radius, which are provided with a certain distance in a direction of a straight line in circle symmetry of the column or the cylinder (center line of the column, or center line of the cylinder).

Furthermore, the shape of the first magnet 10A and the second magnet 20A is a columnar solid shape having a sector cross-sectional shape in the aforementioned first embodiment shown in FIG. 1, and the shape of the first magnet 10A1 and the second magnet 20A1 is a nearly rectangular parallelepiped solid shape in one modification example of the first embodiment shown in FIG. 2, however, the first magnet relating to the present invention can be other shapes of solids such as a cube, a column-shape, a disk-shape, a cylinder-shape, a column having an ellipse shape in sectional planar shape, a spheroid, a sphere, a half-sphere and the like. The same applies to the second magnet of the present invention. Additionally, in the present invention, the first magnet and the second magnet can respectively be formed to be different shapes from each other.

The number of pieces of the above-described first magnets (for example, 10A) is preferably an even number, for example, an integral number such as 4, 6, 8 or the like. If the number of pieces of the first magnets (for example, 10A) is the even number (for example, 2m pieces, 'm' is the integral number of 2 or more), pairs (2m pairs in total) of adjacent and facing surfaces of the first magnets (for example, 10A) adjacent to each other on the first disk (for example, 11A) can be the state such that all magnetic pole faces having the same polarity are allowed to be pairs, such as (N, N), (S, S), (N, N), (S, S) . . . . Also concerning to the second magnets (for example, 20A), the number of pieces of the second magnets (for example, 20A) can be the even number of the same number as the first magnets (for example, 10A), for example, the integral number such as 4, 6, 8 and so on (for example, 2m pieces. 'm' is the integral number of 2 or more).

In the axial-type magnetic rotation transmitting device described above, concerning the first disk (for example, 11A and the like) and the second disk (for example, 21A and the like), a surface (magnet-installation surface) on which the magnets (for example, the first magnets 10A and the like, the second magnets 20A and the like) are installed is not necessarily required to be a horizontal plane (a plane approximately perpendicular to the driving center line or the driven center line). The magnet installation surface can be, for example, an outer surface of a conical surface or an inner surface of the conical surface and so on, or can be an outer surface of sphere or an inner surface of sphere and so on, and radial ribs, plural projections or recessed portions can be formed on the surface thereof. In short, it is preferable that the first magnets (for example, 10A and the like) are constituted so that they have the N-magnetic pole portion and the S-magnetic pole portion and an extended surface of the boundary surface between the N-magnetic pole portion and the S-magnetic pole portion approximately overlaps with the driving center line, and that the second magnets (for example, 20A and the like) are constituted so that they have the N-magnetic pole portion and the S-magnetic pole portion and the extended surface of the boundary surface between the N-magnetic pole portion and the S-magnetic pole portion approximately overlaps with the driven center line. In the case that the magnet-installation surface of the first disk (for example, 11A and the like) is the outer surface of the conical surface and the magnet-installation surface of the second disk (for example, 21A and the like) is the inner surface of the conical surface (or outer and inner surfaces of the sphere and so on), it is preferable that the magnet-installation surface of the first disk (for example, 11A and the like) and the magnet-installation surface of the second disk (for example, 21A and the like) are approximately parallel to each other from a stand point of using the magnet force efficiently. Just similarly, in the radial-type magnetic rotation transmitting device described above, concerning the cylinder (for example, 11B and the like) and the column (for example, 21B and the like), a surface (magnet-installation surface) on which the magnets (for example, the first magnets 10A and the like, the second magnets 20A and the like) are installed is not necessarily required to be a cylinder surface (an outer cylinder surface and an inner cylinder surface approximately parallel to the driving center line or the driven center line). The magnet-installation surface can be, for example, the outer surface of the conical surface or the inner surface of the conical surface and so on, the outer surface of sphere or the inner surface of sphere and so on, and radial ribs, plural projections or recessed portions can be formed on the surface thereof. In short, it is preferable that the first magnets (for example, 10B and the like) are constituted so that they have the N-magnetic pole portion and the S-magnetic pole portion and the extended surface of the boundary surface between the N-magnetic pole portion and the S-magnetic pole portion approximately overlaps with the driving center line, and that the second magnets (for example, 20B and the like) are constituted so that they have the N-magnetic pole portion and the S-magnetic pole portion and the extended surface of the boundary surface between the N-magnetic pole portion and the S-magnetic pole portion approximately overlaps with the driven center line. In the case that the magnet installation surface of the cylinder (for example, 11B and the like) is the inner surface of the conical surface and the magnet-installation surface of the column (for example, 21B and the like) is the outer surface of the conical surface (or the inverse case, or outer and inner surfaces of the sphere and so on), it is preferable that the magnet installation surface of the cylinder (for example, 11B and the like) and the magnet installation surface of the column (for example, 21B and the like) are approximately parallel to each other from a standpoint of using the magnet force efficiently.

The present invention can be realized in the mechanical industry and the like manufacturing the magnetic rotation transmitting device, the hermetic stirring unit and the electric furnace, and can be utilized in these industries.

What is claimed is:

1. An axial-type magnet rotation transmitting device, comprising:
    a driving rotation body having one or plural magnetic line(s) in which plural first magnets (10A) are disposed in a circumferential direction on a first disk (11A) at almost equal intervals;
    a drive source rotationally driving a drive shaft of said driving rotation body; and
    a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with said driving rotation body with a magnetic coupling gap, which utilizes a magnetic operation and which allows said driven rotation body to rotate by rotationally driving the drive shaft by means of said drive source, and
    wherein the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of said driving rotation body;
    wherein the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of said driven rotation body;
    wherein adjacent and facing surfaces of the first magnets (10A) adjacent to each other on the first disk (11A) are disposed so that magnetic pole faces having the same polarity make pairs, and wherein adjacent and facing surfaces of the second magnets (20A) adjacent to each other on the second disk (21A) are disposed so that the magnetic pole faces having the same polarity make pairs.

2. A radial-type magnet rotation transmitting device, comprising:
a driving rotation body having one or plural magnetic line(s) in which plural first magnets (10B) are disposed in a circumferential direction on an inner wall of a cylinder (11B) at almost equal intervals;
a drive source rotationally driving a drive shaft of said driving rotation body; and
a driven rotation body having one or plural magnet line(s) in which second magnets (20B) of the same number as the first magnets (10B) are disposed in the circumferential direction on an outer wall of a column (21B) housed in the cylinder (11B) at almost equal intervals, symmetrically disposed to, and magnetically coupled with said driving rotation body with a magnetic coupling gap, which utilizes a magnetic operation and which allows the driven rotation body to rotate by rotationally driving the drive shaft by means of said drive source, and
wherein the first magnet (10B) has a N-magnetic pole portion and a S-magnetic pole portion, and an extended surface of a boundary surface between the N-magnetic pole portion and the S-magnetic pole portion approximately overlaps with a driving center line as being a rotation center line of said driving rotation body,
wherein the second magnet (20B) has the N-magnetic pole portion and the S-magnetic pole portion, and the extended surface of the boundary surface between the N-magnetic pole portion and the S-magnetic pole portion approximately overlaps with a driven center line as being the rotation center line of said driven rotation body,
wherein adjacent and facing surfaces of the first magnets (10B) adjacent to each other on the cylinder (11B) are disposed so that magnetic pole faces having the same polarity make pairs, and
wherein adjacent and facing surfaces of the second magnets (20B) adjacent to each other on the column (21B) are disposed so that the magnetic pole faces having the same polarity make pairs.

3. A hermetic stirring unit, comprising:
a hermetic container (31A);
a stirring blade (32A);
a driven shaft (52A); and
a magnetic rotation transmitting device, and
wherein said magnetic rotation transmitting device is an axial-type magnetic rotation transmitting device which includes a driving rotation body having one or plural magnetic line(s) in which plural first magnets (10A) are disposed in a circumferential direction on a first disk (11A) at almost equal intervals, a drive source (41A) rotationally driving a drive shaft (42A) of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap, which utilizes a magnetic operation and which allows the driven shaft (52A) to rotate by rotationally driving the drive shaft (42A) by means of the drive source (41A),
wherein the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body,
wherein the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body,
wherein adjacent and facing surfaces of the first magnets (10A) adjacent to each other on the first disk (11A) are disposed so that magnetic pole faces having the same polarity make pairs,
wherein adjacent and facing surfaces of the second magnets (20A) adjacent to each other on the second disk (21A) are disposed so that the magnetic pole faces having the same polarity make pairs, and
wherein said stirring blade (32A) is rotatably attached to said driven shaft (52A) installed to the driven rotation body so that the driven center line is allowed to be the rotation center line.

4. A hermetic stirring unit, comprising:
a hermetic container (31B);
a stirring blade (32B);
a driven shaft (52B); and
a magnetic rotation transmitting device, and
wherein the magnetic rotation transmitting device is a radial-type magnetic rotation transmitting device which includes a driving rotation body having one or plural magnetic line(s) in which plural first magnets (10B) are disposed in a circumferential direction on an inner wall of a cylinder (11B) at almost equal intervals, a drive source (41B) rotationally driving a drive shaft (42B) of the driving rotation body, and a driven rotation body having one or plural magnet line(s) in which second magnets (20B) of the same number as the first magnets (10B) are disposed in the circumferential direction on an outer wall of a column (21B) housed in the cylinder (11B) at almost equal intervals, symmetrically disposed to, and magnetically coupled with the driving rotation body with a magnetic coupling gap, which utilizes a magnetic operation and which allows the driven shaft (52B) to rotate by rotationally driving the drive shaft (42B) by means of the drive source (41B),
wherein the first magnet (10B) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body,
wherein the second magnet (20B) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body,
wherein adjacent and facing surfaces of the first magnets (10B) adjacent to each other on the cylinder (11B) are disposed so that magnetic pole faces having the same polarity make pairs,
wherein adjacent and facing surfaces of the second magnets (20B) adjacent to each other on the column (21B)

are disposed so that the magnetic pole faces having the same polarity make pairs, and wherein said stirring blade (32B) is rotatably attached to said driven shaft (52B) installed to the driven rotation body so that the driven center line is allowed to be the rotation center line.

5. A hermetic stirring unit, comprising:

a hermetic container (31C) having a fixing shaft (33A) thereinside, a stirring blade; and a magnetic rotation transmitting device, and wherein said magnetic rotation transmitting device is an axial-type magnetic rotation transmitting device which includes a driving rotation body having one or plural magnetic line(s) in which plural first magnets (10A) are disposed in a circumferential direction on a first disk (11A) at almost equal intervals, a drive source (41C) rotationally driving a drive shaft (42C) of the driving rotation body, and a driven rotation body having one or plural magnet line(s) in which second magnets (20C) of the same number as the first magnets (10A) are disposed in the circumferential direction on a second disk (21C) at almost equal intervals, symmetrically disposed to, and magnetically coupled with the driving rotation body with a magnetic coupling gap, which utilizes a magnetic operation and which allows the driven rotation body to rotate by rotationally driving the drive shaft (42C) by means of the drive source (41C), wherein the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, wherein the second magnet (20C) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, wherein adjacent and facing surfaces of the first magnets (10A) adjacent to each other on the first disk (11A) are disposed so that magnetic pole faces having the same polarity make pairs, wherein adjacent and facing surfaces of the second magnets (20C) adjacent to each other on the second disk (21C) are disposed so that the magnetic pole faces having the same polarity make pairs, and wherein said fixing shaft (33A) is inserted into a driven-shaft through hole as a through hole of a circular section formed so as to include the driven center line of the driven rotation body, the driven rotation body is rotatably attached through bearing members (34A) and said stirring blade is attached to the driven rotation body.

6. A hermetic stirring unit, comprising:

a hermetic container (31D) having a fixing shaft (33B) thereinside;

a stirring blade; and a magnetic rotation transmitting device, and wherein said magnetic rotation transmitting device is a radial-type magnetic rotation transmitting device which includes a driving rotation body having one or plural magnetic line(s) in which plural first magnets (10C) are disposed in a circumferential direction on an outer wall of a column (11C) at almost equal intervals, a drive source (41D) rotationally driving a drive shaft (42D) of the driving rotation body, and a driven rotation body having one or plural magnet line(s) in which second magnets (20D) of the same number as the first magnets (10C) are disposed in the circumferential direction on an inner wall of a cylinder (21D) housing the column at almost equal intervals, symmetrically disposed to, and magnetically coupled with the driving rotation body with a magnetic coupling gap, which utilizes a magnetic operation and which allows the driven rotation body to rotate by rotationally driving the drive shaft (42D) by means of the drive source (41D), wherein the first magnet (10C) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, wherein the second magnet (20D) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, wherein adjacent and facing surfaces of the first magnets (10C) adjacent to each other on the column (11C) are disposed so that magnetic pole faces having the same polarity make pairs, wherein adjacent and facing surfaces of the second magnets (20D) adjacent to each other on the cylinder (21D) are disposed so that the magnetic pole faces having the same polarity make pairs, and wherein said fixing shaft (33B) is inserted into a driven-shaft through hole as a through hole of a circular section formed so as to include the driven center line of the driven rotation body, the driven rotation body is rotatably attached through bearing members (34B) and said stirring blade is attached to the driven rotation body.

7. An electric furnace, comprising:

a pressure resistant vessel;

a crucible provided in said pressure-resistant vessel;

a crucible supporting shaft supporting said crucible;

a heating means heating materials in said crucible;

a pulling shaft of a single crystal for pulling up a crystal from said crucible; and a radial-type magnetic rotation transmitting device rotating said pulling shaft and/or said crucible supporting shaft, and wherein said radial-type magnetic rotation transmitting device includes a drive rotation body having one or plural magnet line(s) in which plural first magnets (10B), (10B) are disposed on an outer periphery to a lower hermetic barrel unit (67) and an upper hermetic barrel unit (68) at almost equal intervals, and a driven rotation body having one or plural magnet line(s) in which second magnets (20B), (20B) of the same number as the respective first magnets (10B), (10B) are disposed in a circumferential direction on outer walls of second rotating columns (21B), (21B) housed in the lower hermetic barrel unit (67) and the upper hermetic barrel unit (68) at almost equal intervals, symmetrically disposed to, and magnetically coupled with the driving rotation body with a magnetic coupling gap, which utilizes a magnetic operation and which allows the second magnets (20B), (20B) to rotate and/or to slide in upper and lower directions by rotationally driving the first magnets (10B), (10B), wherein the first magnets (10B), (10B) respectively have N-magnetic pole portions and a S-magnetic pole portions, and an extended surface of a boundary surface between the N-magnetic pole portion and the S-magnetic pole portion approximately overlaps with a driving center line as being a rotation center line of the driving rotation body, wherein the second magnets (20B), (20B) respectively have the N-magnetic pole portions and the S-magnetic pole portions, and the extended surface of the boundary surface between the N-magnetic pole portion and the S-magnetic pole portion approximately overlaps with a driven center line as being the rotation center line of the driven rotation body, wherein adjacent and facing surfaces of the first magnets (10B), (10B) are disposed so that magnetic pole faces having the same polarity make pairs, wherein adjacent and facing surfaces of the second magnets (20B), (20B) adjacent to each other on the rotating columns (21B), (21B) are disposed so that the magnetic pole faces having the same polarity make pairs, and wherein said crucible and a seed crystal are rotatably attached to said crucible supporting shaft and said pulling shaft installed to the driven rotation body so that the driven center line is allowed to be the rotation center line.

8. An electric furnace, comprising:

a pressure resistant vessel;

a crucible provided in said pressure-resistant vessel;

a crucible supporting shaft rotating said crucible;

a heating means heating materials in said crucible; and an axial-type magnetic rotation transmitting device rotating said crucible, and wherein said axial-type magnetic rotation transmitting device includes a driving rotation body having one or plural magnet line(s) in which plural first magnets (10A) are disposed in a circumferential direction on a first disk (11A) at almost equal intervals, a drive source (41A) rotationally driving a drive shaft (42A) of the driving rotation body, and a driven rotation body having one or plural magnet line(s) in which second magnets (20A) of the same number as the first magnets (10A) are disposed in the circumferential direction on a second disk (21A) at almost equal intervals, symmetrically disposed to, and magnetically coupled with the driving rotation body with a magnetic coupling gap, which utilizes a magnetic operation and which allows the crucible supporting shaft to rotate by rotationally driving the drive shaft (42A) by the drive source (41A), wherein the first magnet (10A) has a N-magnetic pole portion and a S-magnetic pole portion, and an extended surface of a boundary surface between the N-magnetic pole portion and the S-magnetic pole portion approximately overlaps with a driving center line as being a rotation center line of the driving rotation body, wherein the second magnet (20A) has the N-magnetic pole portion and the S-magnetic pole portion, and the extended surface of the boundary surface between the N-magnetic pole portion and the S-magnetic pole portion approximately overlaps with a driven center line as being the rotation center line of the driven rotation body, wherein adjacent and facing surfaces of the first magnets (10A) adjacent to each other on the first disk (11A) are disposed so that magnetic pole faces having the same polarity make pairs, wherein adjacent and facing surfaces of the second magnets (20A) adjacent to each other on the second disk (21A) are disposed so that the magnetic pole faces having the same polarity make pairs, and wherein said crucible is rotatably attached to said crucible supporting shaft installed to the driven rotation body so that the driven center line is allowed to be the rotation center line.

\* \* \* \* \*